(12) United States Patent
Lee et al.

(10) Patent No.: US 12,743,180 B2
(45) Date of Patent: Sep. 22, 2026

(54) DISPLAY DEVICE AND ELECTRONIC APPARATUS INCLUDING THE SAME

(71) Applicant: SAMSUNG DISPLAY CO., LTD., Yongin-si (KR)

(72) Inventors: Minchan Lee, Yongin-si (KR); Sejin Kim, Yongin-si (KR); Sung-Jin Yang, Yongin-si (KR); Taeik Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/175,283

(22) Filed: Apr. 10, 2025

(65) Prior Publication Data

US 2026/0037092 A1 Feb. 5, 2026

(30) Foreign Application Priority Data

Jul. 31, 2024 (KR) ........................ 10-2024-0101460

(51) Int. Cl.

*G06F 3/044* (2006.01)
*H10K 59/131* (2023.01)
*H10K 59/40* (2023.01)

(52) U.S. Cl.

CPC .......... *G06F 3/0446* (2019.05); *G06F 3/0445* (2019.05); *H10K 59/1315* (2023.02); *H10K 59/40* (2023.02); *G06F 2203/04111* (2013.01)

(58) Field of Classification Search

None
See application file for complete search history.

(56) References Cited

U.S. PATENT DOCUMENTS

| | | | | |
|---|---|---|---|---|
| 8,511,989 | B2 | 8/2013 | Matsushita | |
| 11,016,621 | B1 * | 5/2021 | Lin | G06F 3/0446 |
| 2009/0303189 | A1 * | 12/2009 | Grunthaner | H05K 3/24 345/173 |
| 2011/0057893 | A1 | 3/2011 | Kim et al. | |
| 2016/0216827 | A1 | 7/2016 | Lee et al. | |

(Continued)

FOREIGN PATENT DOCUMENTS

| | | | |
|---|---|---|---|
| JP | 2016-224631 | A2 | 12/2016 |
| KR | 10-2009-0083409 | A | 8/2009 |
| KR | 10-1082293 | B1 | 11/2011 |

(Continued)

*Primary Examiner* — Brian M Butcher

(74) *Attorney, Agent, or Firm* — F. CHAU & ASSOCIATES, LLC

(57) ABSTRACT

A display device includes: a display panel including a light-emitting element; and an input sensor disposed on the display panel and including a first insulating layer, a sensing electrode, and a signal line electrically connected to the sensing electrode, wherein the sensing electrode includes: a first sensing conductive layer disposed on the first insulating layer; and a second sensing conductive layer electrically connected to the first sensing conductive layer and disposed on the first insulating layer, and the signal line includes: a first metal layer including molybdenum-niobium (MoNb) alloy; a second metal layer including aluminum-neodymium (AlNd) alloy and disposed on the first metal layer; and a third metal layer including molybdenum-niobium (MoNb) alloy and disposed on the second metal layer.

18 Claims, 14 Drawing Sheets

(56) References Cited

U.S. PATENT DOCUMENTS

| | | | |
|---|---|---|---|
| 2022/0140011 | A1 | 5/2022 | Oh et al. |
| 2024/0272742 | A1 | 8/2024 | Yang et al. |

FOREIGN PATENT DOCUMENTS

| | | | |
|---|---|---|---|
| KR | 10-2016-0093187 | A | 8/2016 |
| KR | 10-1908982 | B1 | 10/2018 |
| KR | 10-2040647 | B1 | 11/2019 |

* cited by examiner

DISPLAY DEVICE AND ELECTRONIC APPARATUS INCLUDING THE SAME

CROSS-REFERENCE TO RELATED APPLICATION

This U.S. non-provisional patent application claims priority under 35 U.S.C. § 119 to Korean Patent Application No. 10-2024-0101460, filed on Jul. 31, 2024, the disclosure of which is incorporated by reference herein in its entirety.

TECHNICAL FIELD

The present inventive relates to a display device and an electronic apparatus including the same, and more particularly, to a display device including a display panel and an input sensor and an electronic apparatus including the display device.

DISCUSSION OF THE RELATED ART

Multimedia electronic apparatuses such as televisions, mobile phones, tablet PCs, navigation devices, and game consoles include a display device which provides an image to a user through a display screen. The display device may include a touch-based input method which enables a user to intuitively and conveniently input information or a command, such as selecting options, navigating interfaces, or controlling various functions of the electronic apparatus.

Generally, the display device may include a display panel which generates an image, and an input sensor which senses a user's touch input.

SUMMARY

According to an embodiment of the present inventive, a display device includes: a display panel including a light-emitting element; and an input sensor disposed on the display panel and including a first insulating layer, a sensing electrode, and a signal line electrically connected to the sensing electrode, wherein the sensing electrode includes: a first sensing conductive layer disposed on the first insulating layer; and a second sensing conductive layer electrically connected to the first sensing conductive layer and disposed on the first insulating layer, and the signal line includes: a first metal layer including molybdenum-niobium (MoNb) alloy; a second metal layer including aluminum-neodymium (AlNd) alloy and disposed on the first metal layer; and a third metal layer including molybdenum-niobium (MoNb) alloy and disposed on the second metal layer.

In an embodiment of the present inventive concept, the signal line extends in at least a first direction, and the first metal layer is disposed in the third metal layer, and the second metal layer is disposed in the first metal layer.

In an embodiment of the present inventive concept, the signal line extends in at least a first direction, the first metal layer includes an upper surface, a lower surface, and a side surface, wherein the upper surface faces the second metal layer, wherein the lower surface is opposed to the upper surface, and the side surface connects the upper surface and the lower surface to each other, the second metal layer is directly disposed on a portion of the upper surface of the first metal layer, and the third metal layer is directly disposed on the side surface and a remaining portion, on which the second metal layer is not disposed, of the upper surface of the first metal layer, and the first metal layer and the third metal layer are electrically connected to each other.

In an embodiment of the present inventive concept, the signal line further includes an oxide film disposed between the second metal layer and the third metal layer.

In an embodiment of the present inventive concept, the input sensor includes a sensing region, in which an external input is sensed, and a non-sensing region adjacent to the sensing region, wherein the sensing electrode is disposed in the sensing region, and the signal line is disposed in the non-sensing region.

In an embodiment of the present inventive concept, the sensing electrode includes:

a first sensing electrode extending along a first direction and arranged along a second direction perpendicular to the first direction; and a second sensing electrode extending along the second direction and arranged along the first direction.

In an embodiment of the present inventive concept, the first sensing electrode includes a first sensing portion, a second sensing portion spaced apart from the first sensing portion, and an intermediate portion disposed between the first sensing portion and the second sensing portion, wherein the second sensing electrode includes a first sensing pattern, a second sensing pattern spaced apart from the first sensing pattern, and a bridge electrically connecting the first sensing pattern and the second sensing pattern to each other, wherein the bridge includes a first bridge pattern, a second bridge pattern connected to the first sensing pattern, and a third bridge pattern connected to the second sensing pattern, and the first bridge pattern is connected to each of the second bridge pattern and the third bridge pattern, wherein the second bridge pattern and the third bridge pattern are at least portions of the first sensing conductive layer, and the first sensing portion, the second sensing portion, the intermediate portion, and the first bridge pattern are at least portions of the second sensing conductive layer.

In an embodiment of the present inventive concept, an opening is defined in the intermediate portion, and the first bridge pattern is disposed in the opening.

In an embodiment of the present inventive concept, the first sensing conductive layer includes molybdenum-niobium (MoNb) alloy, and the second sensing conductive layer includes indium tin oxide (ITO).

In an embodiment of the present inventive concept, the signal line is disposed under the first insulating layer.

In an embodiment of the present inventive concept, the input sensor further includes a second insulating layer disposed on the first insulating layer, and the second sensing conductive layer is disposed between the first insulating layer and the second insulating layer.

In an embodiment of the present inventive concept, the second sensing conductive layer is in contact with the first sensing conductive layer through a contact hole penetrating in the first insulating layer.

In an embodiment of the present inventive concept, the first sensing conductive layer and the third metal layer are formed through a same photolithography process.

In an embodiment of the present inventive concept, each of the first insulating layer and the second insulating layer includes silicon oxide, silicon nitride, or silicon oxynitride.

In an embodiment of the present inventive concept, the first sensing conductive layer has a single-layered structure.

According to an embodiment of the present inventive concept, an electronic apparatus includes: a processor; a memory having stored application programs for execution by the processor; a display device including an active region and a peripheral region adjacent to the active region, wherein in the active region, an image is displayed and an external input is sensed, wherein the processor is caused to execute one or more of the stored application programs upon receipt of the external input; and a window member disposed on the display device and including a transmission region corresponding to the active region and a bezel region corresponding to the peripheral region, wherein the display device includes: a display panel including a light-emitting element; and an input sensor disposed on the display panel and including a first insulating layer, a sensing electrode, and a signal line electrically connected to the sensing electrode, wherein the sensing electrode includes: a first sensing conductive layer disposed on the first insulating layer; and a second sensing conductive layer electrically connected to the first sensing conductive layer and disposed on the first insulating layer, and the signal line includes: a first metal layer including molybdenum-niobium (MoNb) alloy; a second metal layer including aluminum-neodymium (AlNd) alloy and disposed on the first metal layer; and a third metal layer including molybdenum-niobium (MoNb) alloy and disposed on the second metal layer.

In an embodiment of the present inventive concept, the signal line extends in at least a first direction, and the first metal layer is disposed in the third metal layer, and the second metal layer is disposed in the first metal layer.

In an embodiment of the present inventive concept, the signal line extends in at least a first direction, the first metal layer includes an upper surface, a lower surface, and a side surface, wherein the upper surface faces the second metal layer, wherein the lower surface is opposed to the upper surface, and the side surface connects the upper surface and the lower surface to each other, the second metal layer is directly disposed on a portion of the upper surface of the first metal layer, and the third metal layer is directly disposed on the side surface and a remaining portion, on which the second metal layer is not disposed, of the upper surface of the first metal layer, and the first metal layer and the third metal layer are electrically connected to each other.

In an embodiment of the present inventive concept, the signal line further includes an oxide film disposed between the second metal layer and the third metal layer.

In an embodiment of the present inventive concept, the first sensing conductive layer includes molybdenum-niobium (MoNb) alloy, and the second sensing conductive layer includes indium tin oxide (ITO).

BRIEF DESCRIPTION OF THE FIGURES

The above and other objects and features of the present inventive concept will become apparent by describing in detail embodiments thereof with reference to the accompanying drawings.

DETAILED DESCRIPTION OF THE EMBODIMENTS

Figure 1A:
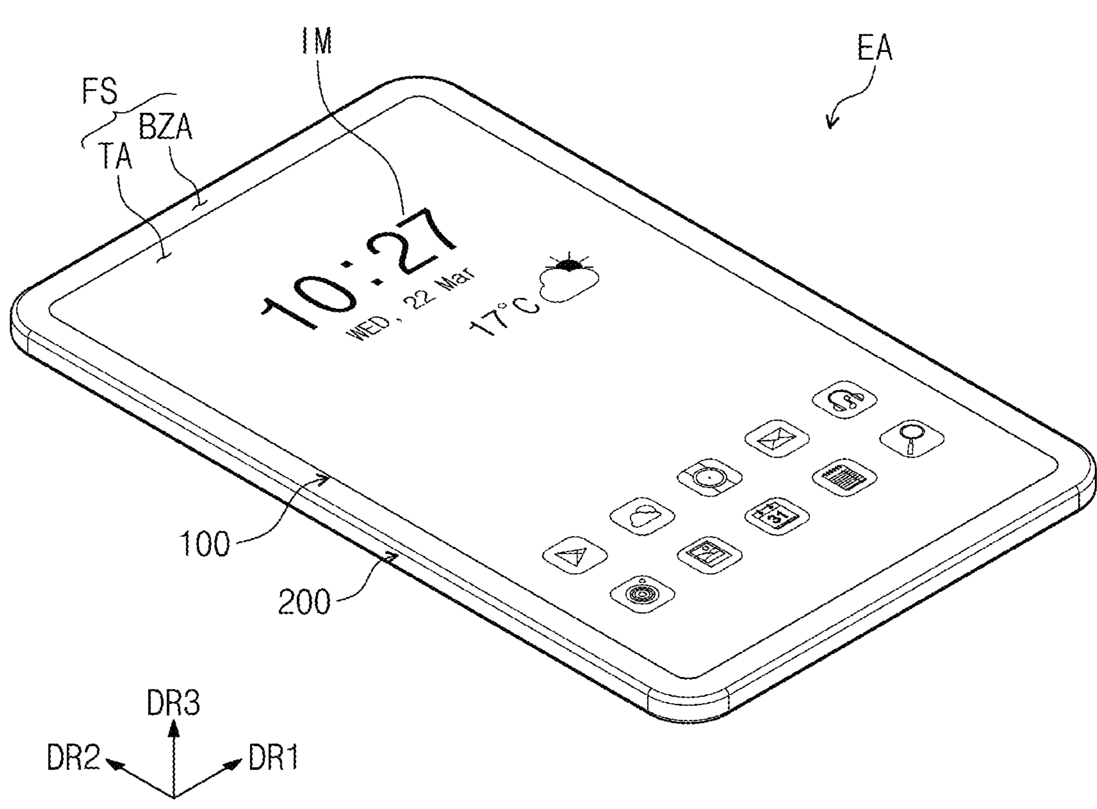
FIG. 1A is a perspective view of an electronic apparatus according to an embodiment of the present inventive concept.

Embodiments of the present inventive concept may be variously modified and have various forms, but embodiments of the present inventive concept will be illustrated in the drawings and described in detail in the description. However, this is not intended to limit the present inventive concept to a specific disclosed form, and it should be understood that all changes, equivalents, and alternatives included in the spirit and scope of the present inventive concept are included in the present inventive concept.

As used herein, the singular forms include the plural forms as well unless the context clearly indicates otherwise.

In this specification, it will be understood that when an element (or a region, a layer, a portion, or the like) is referred to as being "on", "connected to" or "coupled to" another element, it may be directly disposed on, connected or coupled to the other element, or an intervening element may be disposed therebetween.

Also, terms such as "below," "lower," "above," and "upper" may be used to describe the relationships of the components illustrated in the drawings. These terms are used as a spatially relative concept and are described based on the directions indicated in the drawings. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the wording "disposed on" may represent being disposed not only on an upper portion of any one member but also on a lower portion thereof.

As used herein, the wording "directly disposed" may mean that there is no layer, film, region, plate, etc. added between a portion such as a layer, film, region, or plate and another portion. For example, "directly disposed" may mean that two layers or two members are disposed without using an additional member such as an adhesive member therebetween.

As used herein, the term "and/or" includes all of one or more combinations which may be defined by related elements.

Although the terms first, second, etc. may be used herein to describe various elements, these elements should not be limited by these terms. These terms are only used to distinguish one element from another element. For example, a first element may be referred to as a second element, and similarly, a second element may also be referred to as a first element without departing from the spirit and scope of the present inventive concept.

Unless otherwise defined, all terms (including technical and scientific terms) used herein have the same meaning as commonly understood by one of ordinary skill in the art to which the present disclosure belongs. Also, terms, such as those defined in commonly used dictionaries, should be interpreted as having a meaning that is consistent with their meaning in the context of the relevant art and should not be interpreted in an idealized or overly formal sense unless expressly so defined herein.

Like reference numerals or symbols refer to like elements throughout the drawings and specification, and thus, redundant descriptions may be omitted. In addition, various thicknesses, lengths, and angles are shown and while the arrangement shown does indeed represent an embodiment of the present inventive concept, it is to be understood that modifications of the various thicknesses, lengths, and angles may be possible within the spirit and scope of the present disclosure and the present disclosure is not necessarily limited to the particular thicknesses, lengths, and angles shown.

Embodiments of the present inventive concept relate to a display device that includes an input sensor with increased reliability, integrated within an electronic apparatus such as a tablet, smartphone, television, or other multimedia devices. The display device includes a display panel with light-emitting elements and an input sensor disposed on the display panel, allowing for intuitive touch-based inputs.

According to embodiments of the present inventive concept, the input sensor's signal line may include three layers of metals with distinct properties. The first metal layer may include molybdenum-niobium (MoNb) alloy, which may provide excellent corrosion resistance and adhesion. The second metal layer may include aluminum-neodymium (AlNd) alloy, which may offer high electrical conductivity, while the third layer, also of MoNb alloy, which may increase hardness and may protect against scratches and damage. This layered structure may ensure that the signal line maintains its electrical performance even under harsh conditions, such as high humidity or mechanical stress.

The input sensor may include a first sensing electrode and a second sensing electrode arranged perpendicularly to each other. These electrodes may be formed from materials such as indium tin oxide (ITO) for transparency and are separated from each other by insulating layers to maintain signal integrity. The input sensor detects external inputs, such as finger touches or stylus interactions, through variations in mutual capacitance between the electrodes. This design not only ensures accurate input detection but also maintains the display's brightness and image quality by using transparent conductive materials.

Additionally, a method of manufacturing the display device, according to embodiments of the present inventive concept, includes the processes involved in forming the metal layers through sputtering, photolithography and etching. The signal line's layered structure may minimizes signal delay, reduce the need for additional processing steps, and increase the overall reliability of the display device.

Hereinafter, an electronic apparatus and a display device according to an embodiment of the present inventive concept will be described with reference to the accompanying drawings.

Figure 1B:
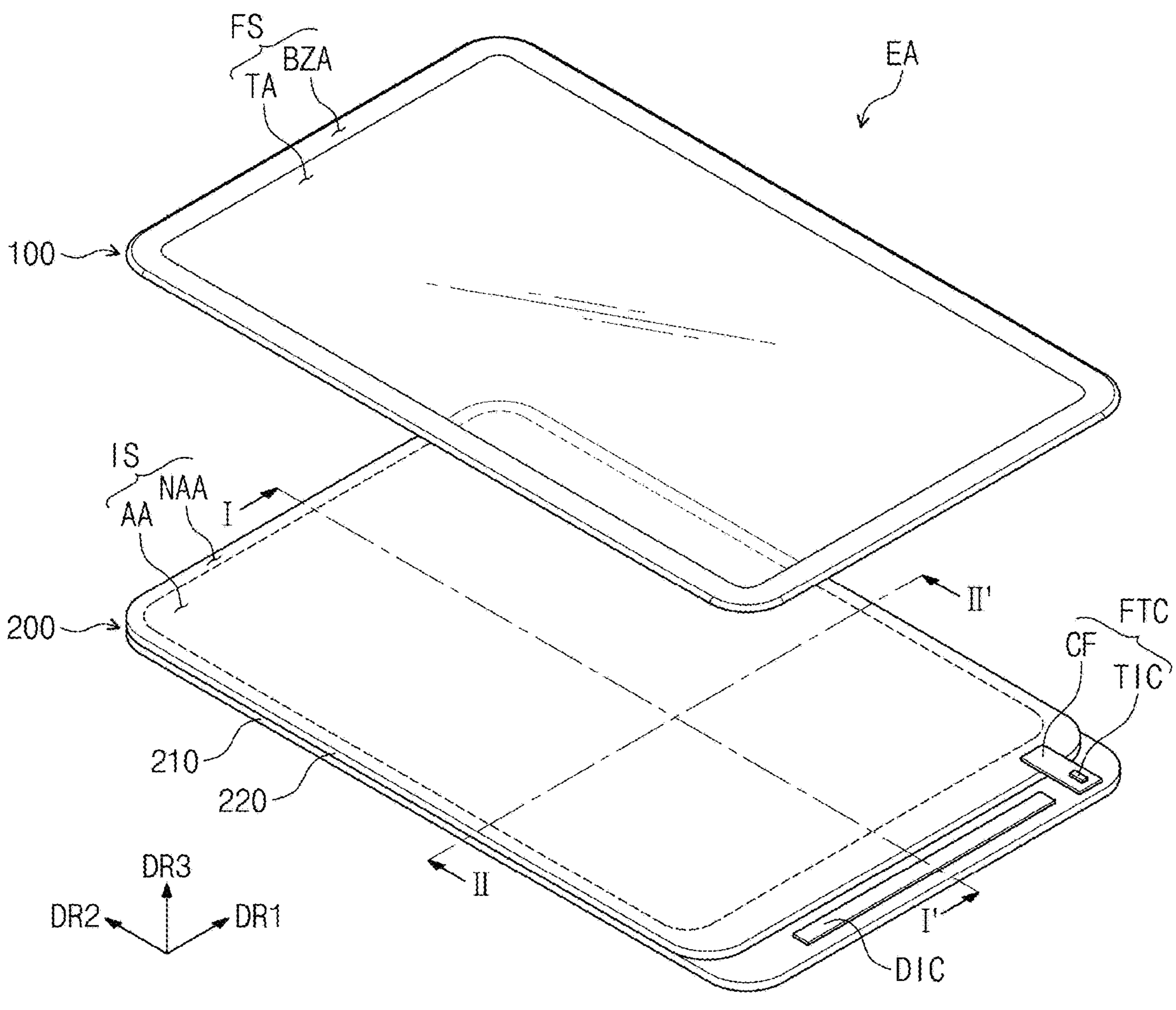
FIG. 1B is an exploded perspective view of an electronic apparatus illustrated in FIG. 1A.
Figure 1C:
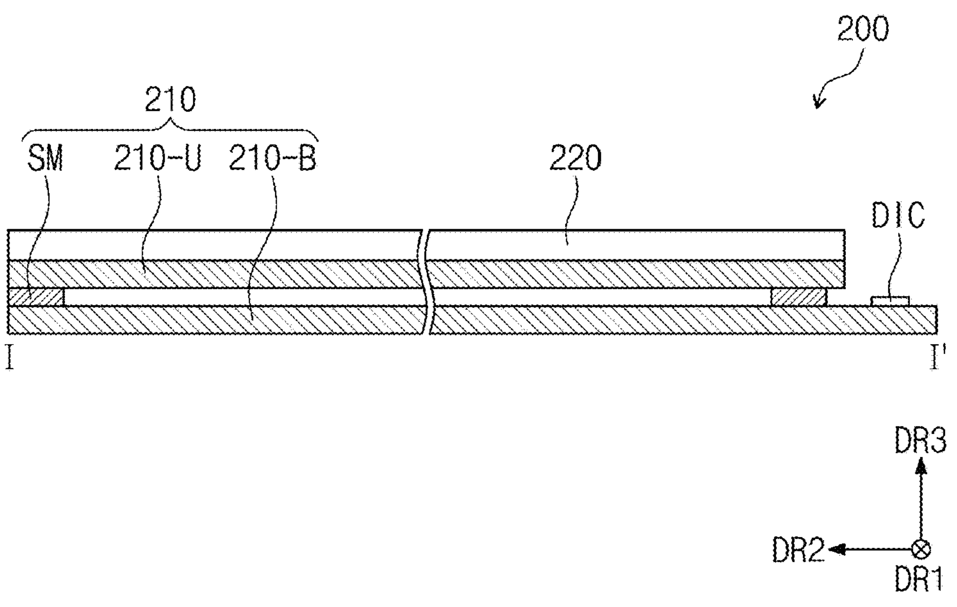
FIG. 1C is a cross-sectional view of a display device taken along line I-I' of FIG. 1B.
Figure 1D:
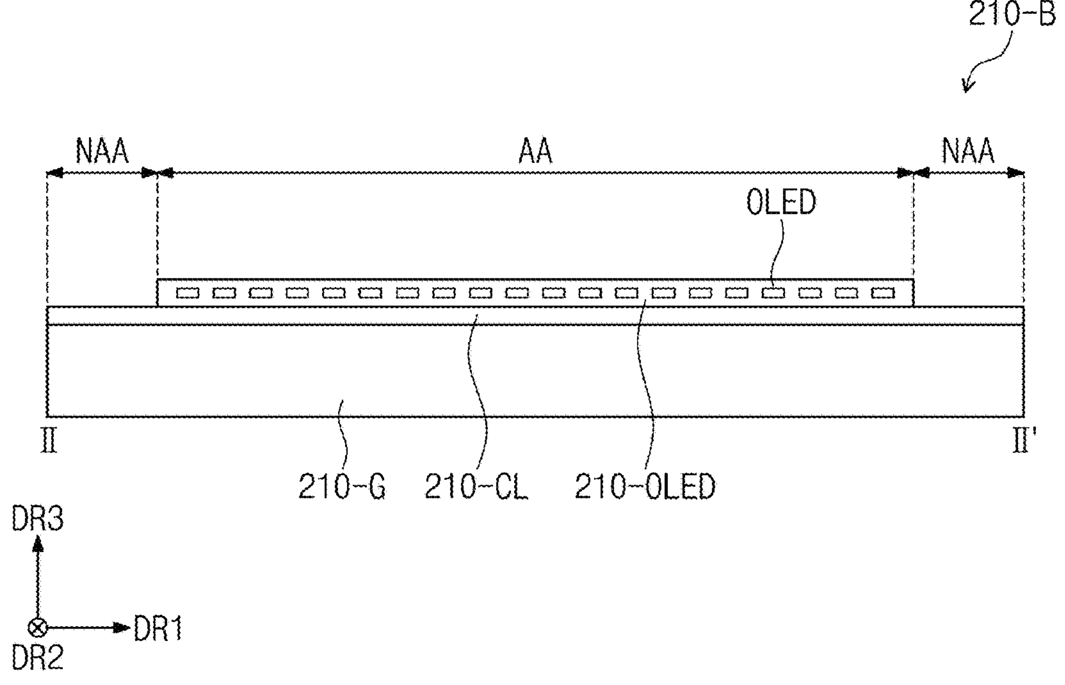
FIG. 1D is a cross-sectional view of a display substrate taken along line II-II' of FIG. 1B.

FIG. 1A is a perspective view of an electronic apparatus EA according to an embodiment of the present inventive concept. FIG. 1B is an exploded perspective view of the electronic apparatus EA illustrated in FIG. 1A. FIG. 1C is a cross-sectional view of a display device 200 taken along line I-I' of FIG. 1B. FIG. 1D is a cross-sectional view of a display substrate 210-B taken along line II-II' of FIG. 1B.

Hereinafter, the electronic apparatus EA according to the present embodiment will be described with reference to FIGS. 1A to 1D.

Referring to FIG. 1A, the electronic apparatus EA may be activated in response to an electrical signal. The electronic apparatus EA may include various embodiments. For example, the electronic apparatus EA may include a tablet PC, a laptop, a computer, a smart television, an automotive display, etc. In the present embodiment, the electronic apparatus EA is illustrated as a tablet PC as an example.

The electronic apparatus EA may display an image IM through a display surface FS. The display surface FS is parallel to a plane defined by a first direction DR1 and a second direction DR2 crossing the first direction DR1. A third direction DR3 indicates a normal direction of the display surface FS, that is, a thickness direction of the electronic apparatus EA. A front surface (or, e.g., an upper surface) and a rear surface (or, e.g., a lower surface) of each component or unit described below are defined with reference to the third direction DR3.

The display surface FS on which the image IM is displayed may correspond to a front surface of the electronic apparatus EA and a front surface FS of a window member 100, which is to be described later with reference to FIG. 1B. Hereinafter, the display surface and the front surface of the electronic apparatus EA, and the front surface of the window member 100 will be denoted as the same reference numerals or symbols. FIG. 1A illustrates a clock and a plurality of icons as an example of the image IM.

Referring to FIG. 1B, the electronic apparatus EA includes the window member 100 and the display device 200. In an embodiment of the present inventive concept, the electronic apparatus EA may further include an optical member disposed between the window member 100 and the display device 200. The optical member may include, for example, a polarizer. For example, the optical member may include a color filter member which lowers reflectance for external light.

The window member 100 includes a base substrate. For example, the base substrate may be formed of glass, plastic, or a combination thereof. The front surface FS of the window member 100 includes a transmission region TA and a bezel region BZA. The transmission region TA may be an optically transparent region. For example, the transmission region TA may be a region having a visible light transmittance of about 90% or more.

The bezel region BZA may be a region having a relatively low light transmittance compared to the transmission region TA. The bezel region BZA have a shape that at least partially surrounds a shape of the transmission region TA. The bezel region BZA may be adjacent to the transmission region TA and surround the transmission region TA. The window member 100 may include a light blocking pattern which is disposed on the base substrate and defines the bezel region BZA. For example, the light-blocking pattern may prevent light transmission in the bezel region BZA.

The bezel region BZA may have a color. The bezel region BZA may cover a peripheral region NAA of the display device 200, thereby preventing the peripheral region NAA from being viewed from outside of the electronic apparatus EA. This is illustrated as an example, and in the window member 100 according to an embodiment of the present inventive concept, the bezel region BZA may be reduced or may be omitted.

The display device 200 may generate the image IM (see FIG. 1A) and sense an external input. A front surface FS of the display device 200 includes an active region AA and the peripheral region NAA. The active region AA may be a region activated in response to an electrical signal.

In the present embodiment, the active region AA may be a region in which the image IM is displayed and an external input is sensed. The active region AA corresponds to the transmission region TA, and the peripheral region NAA corresponds to the bezel region BZA. For example, the active region AA overlaps the transmission region TA, and the peripheral region NAA overlaps the bezel region BZA. For example, the active region AA may have a different shape from or the same shape as the shape of the transmission region TA, and the peripheral region NAA may have a different shape from or the same shape as the shape of the bezel region BZA.

Referring to FIGS. 1B and 1C, the display device 200 includes a display panel 210, an input sensor 220, a driving circuit DIC, and a circuit module FTC.

The display panel 210 may be an organic light-emitting display panel or an inorganic light-emitting display panel. The panels are distinguished according to a material of a light-emitting element. An emission layer of the organic light-emitting display panel may include an organic light-emitting material. For example, an emission layer of the inorganic light-emitting display panel may include quantum dots, quantum rods, and/or the like. Hereinafter, the display panel 210 will be described as an organic light-emitting display panel.

The input sensor 220 senses an external input applied from the outside. For example, the external input may be a user's touch or an input of an object such as a stylus pen. In the present embodiment, the input sensor 220 may be a capacitive touch sensor and is not particularly limited.

The driving circuit DIC is disposed on the display panel 210. The driving circuit DIC may be mounted on the display panel 210. The driving circuit DIC is electrically connected to the display panel 210 and provides an electrical signal for driving the display panel 210.

The circuit module FTC is electrically connected to the input sensor 220. In the present embodiment, the circuit module FTC may include a flexible circuit board CF and a sensor driving circuit TIC. For example, the flexible circuit board CF may include an insulating layer and a plurality of lines. The lines electrically connect the input sensor 220 and the sensor driving circuit TIC to each other. The sensor driving circuit TIC may be mounted, in a chip-on-film form, on the flexible circuit board CF.

The circuit module FTC may connect the input sensor 220 and the display panel 210 to each other. The sensor driving circuit TIC may be omitted. In an embodiment of the present inventive concept, the sensor driving circuit TIC and the driving circuit DIC may be integrated as a single unit.

Referring to FIG. 1C, the display panel 210 includes a display substrate 210-B, an encapsulation substrate 210-U, and a sealing member SM which bonds the display substrate 210-B and the encapsulation substrate 210-U to each other. The display substrate 210-B includes pixels which generate an image. The encapsulation substrate 210-U encapsulates the pixels and prevents the pixels from being damaged by, for example, moisture, oxygen, etc., of the outside.

The driving circuit DIC may be coupled to the display substrate 210-B. The driving circuit DIC may be provided in a form of an integrated chip. However, an embodiment of the present inventive concept is not limited thereto, and in an embodiment of the present inventive concept, the driving circuit DIC is not disposed on the display substrate 210-B. The driving circuit DIC may be mounted on a circuit board that is separate from the display substrate 210-B and connected to the display substrate 210-B.

For example, the display substrate 210-B and the encapsulation substrate 210-U may include a glass substrate as a base substrate. An area of the display substrate 210-B may be larger than an area of the encapsulation substrate 210-U. The driving circuit DIC may be disposed in a partial region of the display substrate 210-B that is exposed (e.g., not covered by) from the encapsulation substrate 210-U. However, an embodiment of the present inventive concept is not limited thereto, and in an embodiment of the present inventive concept, a shape and size of the display substrate 210-B may be substantially the same as those of the encapsulation substrate 210-U such that the driving circuit DIC is covered (e.g., not exposed by) by the encapsulation substrate 210-U.

The sealing member SM may include, for example, frit. The frit is a ceramic adhesive material and has a characteristic of being cured after exposure. For example, the frit may include about 15 to about 40 wt % of $V_2O_5$, about 10 to about 30 wt % of $TeO_2$, about 1 to about 15 wt % of $P_2O_5$, about 1 to about 15 wt % of BaO, about 1 to about 20 wt % of ZnO, about 5 to about 30 wt % of $ZrO_2$, and about 5 to about 20 wt % of $WO_3$ as main ingredients and include at least one of $Fe_2O_3$, CuO, MnO, $Al_2O_3$, $Na_2O$, or $Nb_2O_5$ as an additive. The sealing member SM overlaps the peripheral region NAA.

Referring to FIG. 1D, the display substrate 210-B includes a base substrate 210-G, a circuit element layer 210-CL disposed on the base substrate 210-G, and a display element layer 210-OLED disposed on the circuit element layer 210-CL. In an embodiment of the present inventive concept, the display substrate 210-B may further include an encapsulation layer or a capping layer covering the display element layer 210-OLED.

The base substrate 210-G may include, for example, a glass substrate, a metal substrate, an organic/inorganic composite material substrate, or the like. The circuit element layer 210-CL includes, for example, at least one insulating layer and a circuit element. The insulating layer includes at least one inorganic layer and at least one organic layer. The circuit element includes signal lines and a pixel driving circuit. The pixel driving circuit may be provided for each pixel. The display element layer 210-OLED may include light-emitting elements OLED. The light-emitting element OLED may be provided for each pixel. The pixel driving circuit controls the operation of the light-emitting OLED, including turning the light-emitting element OLED on/off and adjusting its luminance based on an input signal. The light-emitting element OLED may include an organic light-emitting diode.

FIGS. 2A to 2D are cross-sectional views illustrating a method for manufacturing a display device 200 according to an embodiment of the present inventive concept.

Figure 2A:
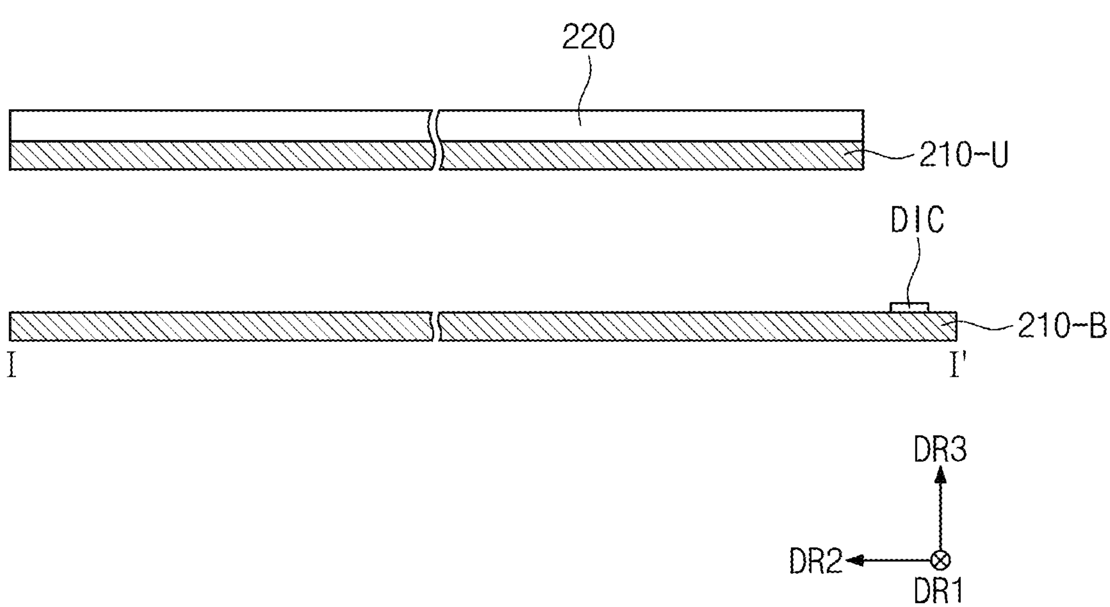
FIGS. 2A, 2B, 2C, and 2D are cross-sectional views illustrating a method for manufacturing a display device according to an embodiment of the present inventive concept.

First, as illustrated in FIG. 2A, a display substrate 210-B and an input sensor 220 are prepared. The display substrate 210-B on which a driving circuit DIC is mounted is illustrated as an example, but an embodiment of the present inventive concept is not limited thereto. At this stage, the driving circuit DIC may be omitted, and the driving circuit DIC may be mounted on the display substrate 210-B after a manufacturing process that is to be described later. An encapsulation substrate 210-U may be a base substrate on which the input sensor 220 may be formed. The input sensor 220 is formed on one surface of the encapsulation substrate 210-U.

Figure 2B:
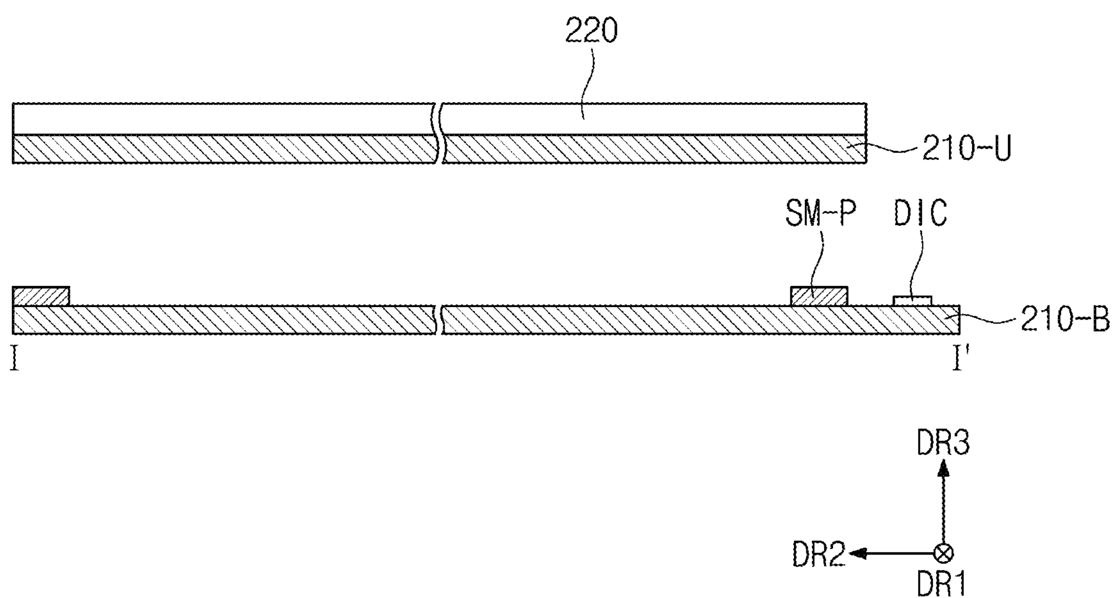

As illustrated in FIG. 2B, a sealing composition SM-P is provided between the display substrate 210-B and the encapsulation substrate 210-U. The sealing composition SM-P is provided in a peripheral region NAA of the circuit element layer 210-CL illustrated in FIG. 1D. Thereafter, the encapsulation substrate 210-U is aligned on the display substrate 210-B. One surface of the encapsulation substrate 210-U, on which the input sensor 220 is not disposed, may face the sealing composition SM-P.

Figure 2C:
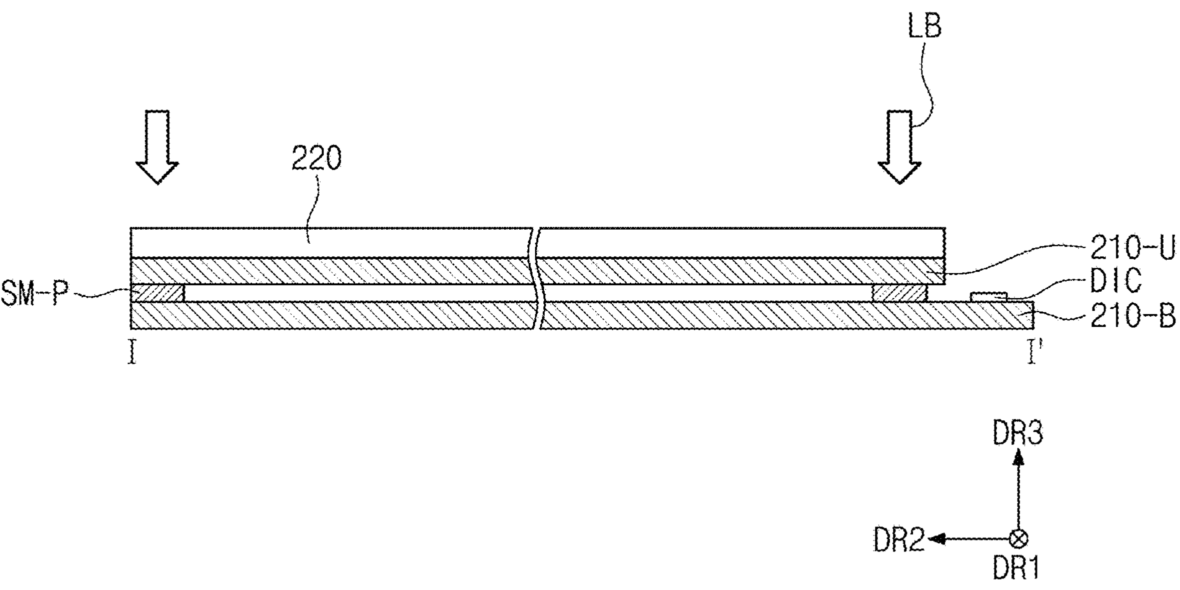

As illustrated in FIG. 2C, a laser beam LB is emitted to the sealing composition SM-P from above the input sensor 220. The sealing composition SM-P, when exposed to the laser beam LB, undergoes a curing process that solidifies and bonds the encapsulation substrate 210-U to the display substrate 210-B.

Figure 2D:
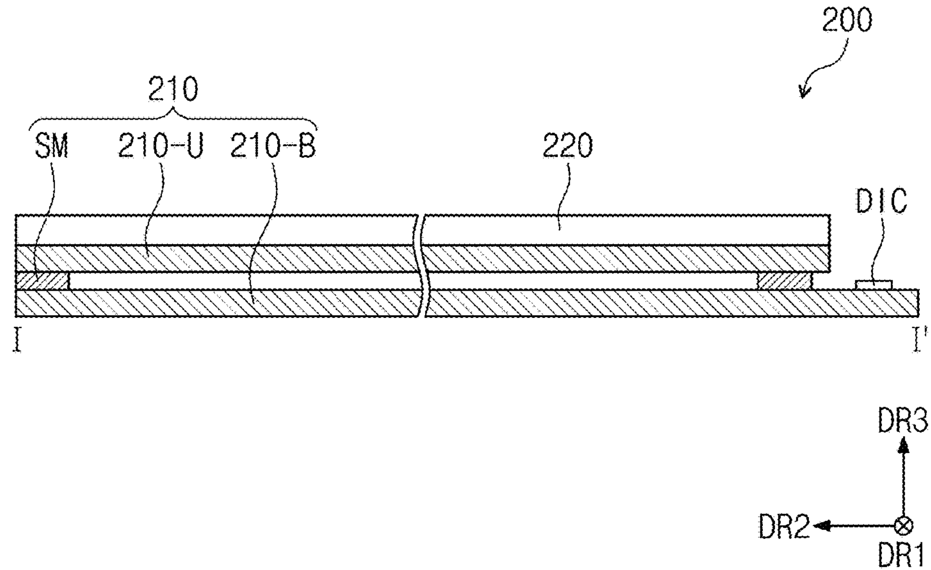

As illustrated in FIG. 2D, the cured sealing composition SM-P forms a sealing member SM. The encapsulation substrate 210-U encapsulates the display element layer 210-OLED of FIG. 1D and may protect an organic light-emitting diode from moisture and oxygen of the outside.

Figure 3:
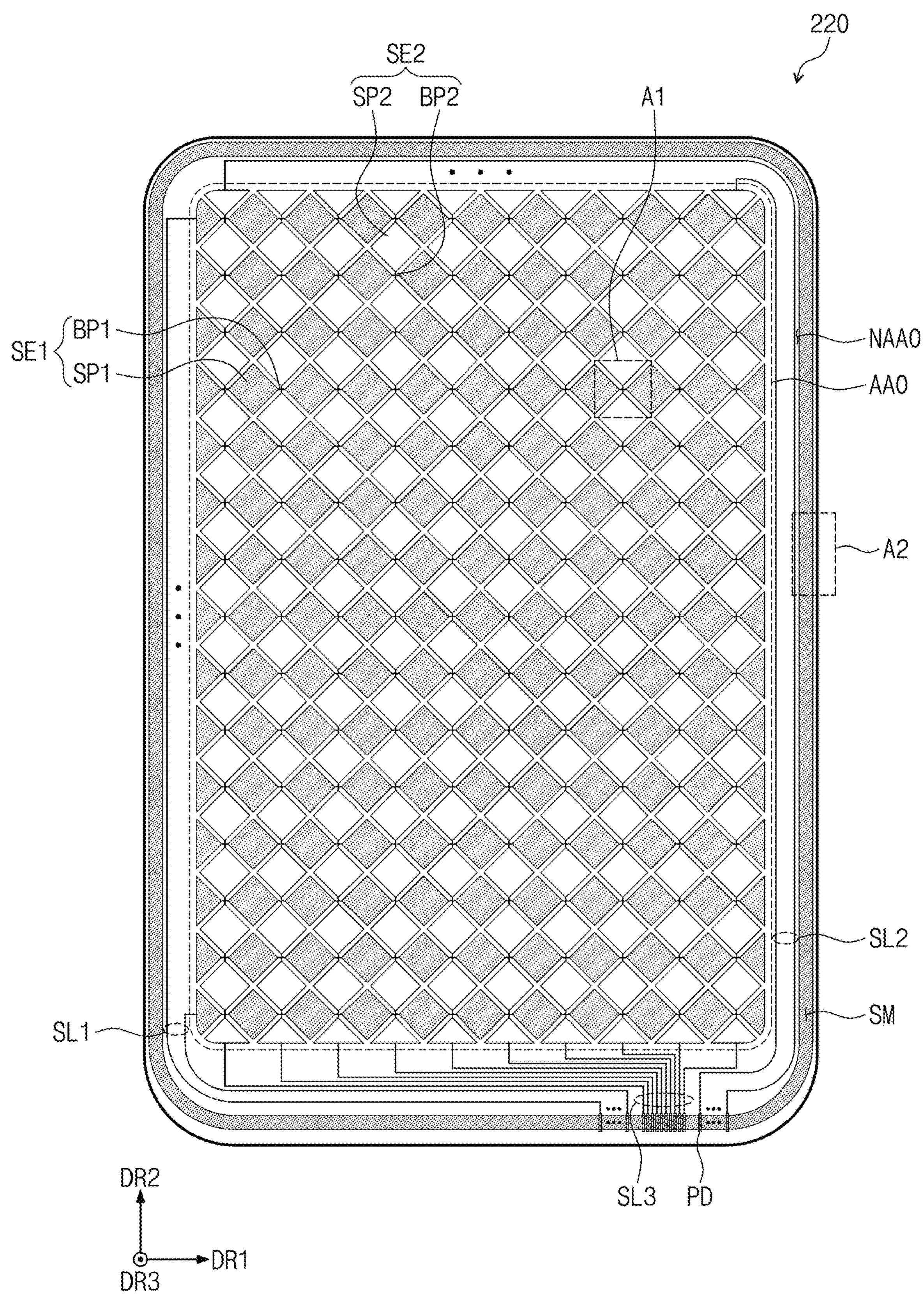
FIG. 3 is a plan view of an input sensor according to an embodiment of the present inventive concept.

FIG. 3 is a plan view of an input sensor 220 according to an embodiment of the present inventive concept. FIG. 3 illustrates a sensing region AAO and a non-sensing region NAA0, of the input sensor 220, respectively corresponding to an active region AA and a peripheral region NAA of the display panel 210 of FIG. 1B.

The input sensor 220 may include a plurality of sensing electrodes SE1 and SE2 and a plurality of signal lines SL1, SL2, and SL3 connected to the plurality of sensing electrodes SE1 and SE2. The sensing electrodes SE1 and SE2 are disposed in the sensing region AAO. The sensing electrodes SE1 and SE2 may include a plurality of first sensing electrodes SE1 and a plurality of second sensing electrodes SE2 crossing the plurality of first sensing electrodes SE1.

In the present embodiment, the first sensing electrodes SE1 may extend along the first direction DR1 and may be arranged along the second direction DR2. The first sensing electrodes SE1 may each include a plurality of sensing portions SP1 (hereinafter, a first group of sensing portions) arranged along the first direction DR1 and a plurality of intermediate portions BP1 (hereinafter, a first group of intermediate portions). The second sensing electrodes SE2 may extend along the second direction DR2 and may be arranged along the first direction DR1. The second sensing electrodes SE2 may each include a plurality of sensing portions SP2 (hereinafter, a second group of sensing portions) arranged along the second direction DR2 and a plurality of intermediate portions BP2 (hereinafter, a second group of intermediate portions).

In an embodiment of the present inventive concept, the input sensor 220 may include only one type of sensing electrode. Such an input sensor 220 may sense an external input by using a self-capacitance method.

The signal lines SL1, SL2, and SL3 are disposed in the non-sensing region NAA0. The signal lines SL1, SL2, and SL3 may include a plurality of first signal lines SL1, a plurality of second signal lines SL2, and a plurality of third signal lines SL3. Pads PD are connected to ends of the respective signal lines SL1, SL2, and SL3. As illustrated in FIG. 3, the pads PD may be aligned along the first direction DR1.

The first signal lines SL1 are each electrically connected to one end among two ends of each of the first sensing electrodes SE1. The second signal lines SL2 are each electrically connected to one end among two ends of each of the second sensing electrodes SE2. The third signal lines SL3 are each electrically connected to the other end among two ends of each of the second sensing electrodes SE2. As to be described later, each of the signal lines SL1, SL2, and SL3 may be disposed on a different layer from a corresponding sensing electrode SE1 or SE2. The wording "a signal line is electrically connected to a corresponding sensing electrode" described above means that a sensing electrode corresponding to signal lines is in an integrated shape or is in contact with a signal line through a contact hole penetrating an insulating layer.

Connection relationship of the sensing electrodes SE1 and SE2 and the signal lines SL1, SL2, and SL3 is not limited to the above description. According to an embodiment of the present inventive concept, the second signal lines SL2 may be omitted, or the third signal lines SL3 may be omitted. According to an embodiment of the present inventive concept, the input sensor 220 may further include signal lines each connected to the other end among two ends of each of the first sensing electrodes SE1. Here, any one of the second signal lines SL2 or the third signal lines SL3 may be omitted.

According to the present embodiment, the second sensing electrodes SE2 may receive driving signals through the second signal lines SL2 and the third signal lines SL3 (hereinafter, a transmit (TX) electrode function). The sensor driving circuit TIC (see FIG. 1B) may receive sensing signals through the first signal lines SL1 (hereinafter, an RX electrode function). The sensor driving circuit TIC may measure variance of mutual capacitance that occur between the first sensing electrodes SE1 and the second sensing electrodes SE2 by analyzing the sensing signals, allowing the detection of touch inputs based on variations in capacitance caused by a user's touch. However, an embodiment of the present inventive concept is not limited thereto, and a TX electrode function of the first sensing electrodes SE1 and a receiving (RX) electrode function of the second sensing electrodes SE2 may be interchanged. For example, in an embodiment of the present inventive concept, the first signal lines SL1 may receive driving signals.

FIG. 3 illustrates a sealing member SM overlapping the non-sensing region NAA0. The sealing member SM is disposed on an outer side of the signal lines SL1, SL2, and SL3 in a plan view. For example, the sealing member SM may surround the signal lines SL1, SL2, and SL3. The sealing member SM may overlap the pads PD to reduce an area of the non-sensing region NAA0. In an embodiment of the present inventive concept, the sealing member SM may be disposed on a portion of the signal lines SL1, SL2, and SL3.

Figure 4A:
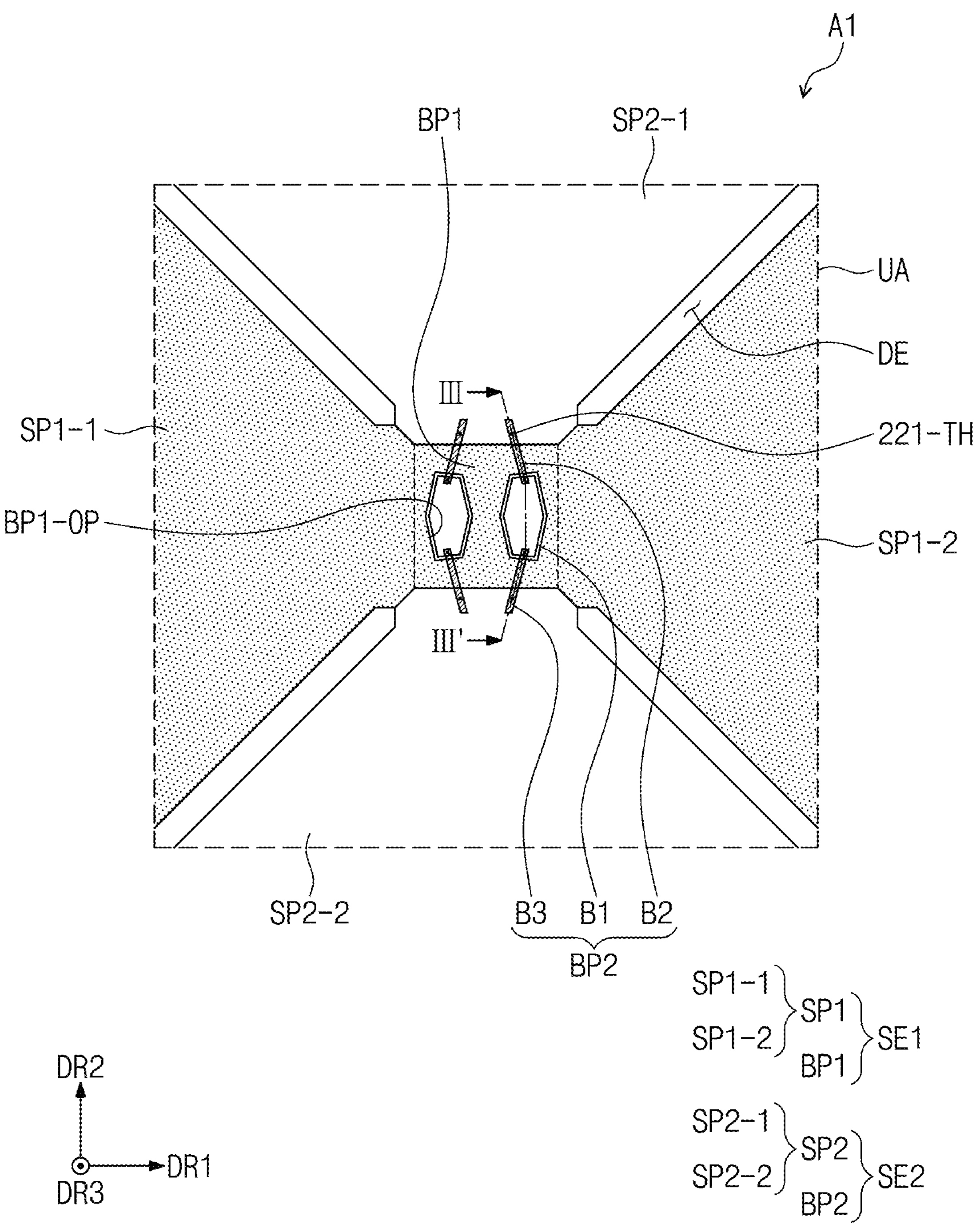
FIG. 4A is a plan view of a first region of FIG. 3.
Figure 4B:
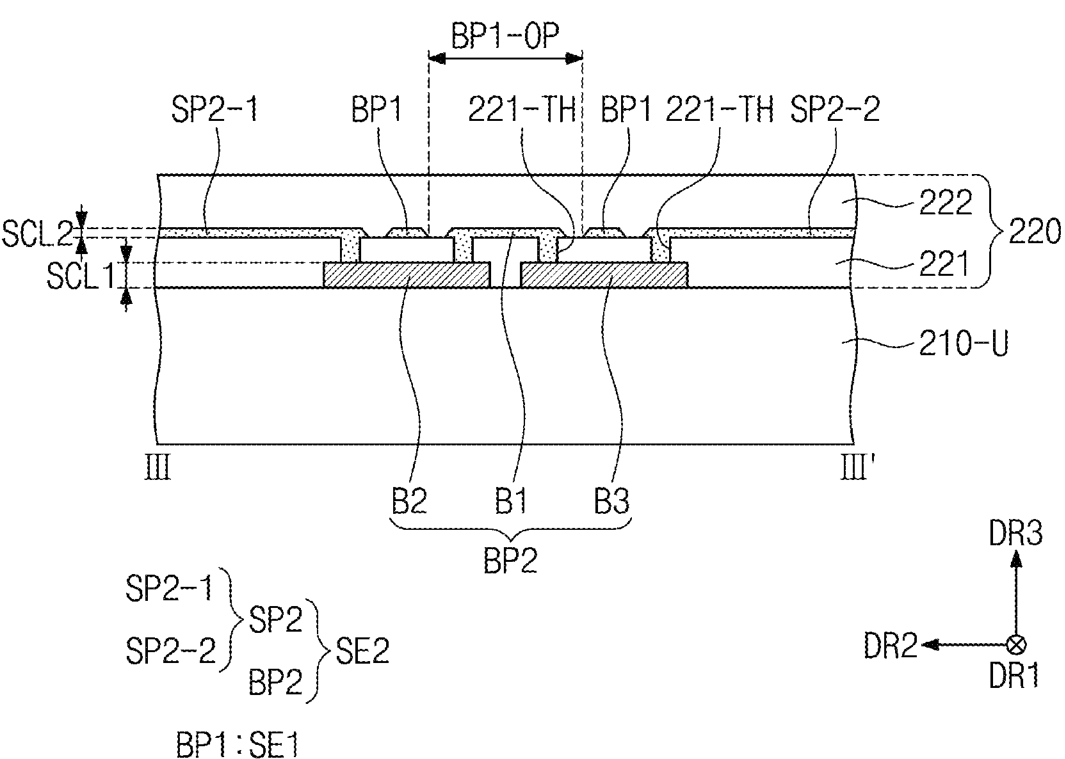
FIG. 4B is a cross-sectional view taken along line III-III' of FIG. 4A.

FIG. 4A is a plan view of a first region A1 of FIG. 3. FIG. 4B is a cross-sectional view taken along line III-III' of FIG. 4A.

As illustrated in FIGS. 4A and 4B, the first region A1 corresponds to one unit region UA. The sensing region AAO of FIG. 3 may include multiple unit regions UA that is shown in FIGS. 4A and 4B, with each unit region forming a part of the overall sensing region AAO used for detecting touch inputs. An intersection region of a first sensing electrode SE1 and a second sensing electrode SE2 is disposed in each unit region UA.

Any one of the first sensing electrode SE1 or the second sensing electrode SE2 may have an integrated shape, and the other thereof may include a plurality of patterns spaced apart from each other. In the present embodiment, the first sensing electrode SE1 having an integrated shape is illustrated as an example. Among the first group of the sensing portions and intermediate portions and the second group of the sensing portions and intermediate portions described with reference to FIG. 3, a group having an integrated shape will be described below as a sensing portion and an intermediate portion, and a group not having an integrated shape will be described below as a sensing pattern and a bridge.

The second sensing electrode SE2 may include a plurality of sensing patterns SP2 and bridges BP2 disposed between adjacent sensing patterns SP2 and electrically connecting the adjacent sensing patterns SP2 to each other. One of two adjacent sensing patterns may be a first sensing pattern SP2-1, and the other thereof may be a second sensing pattern SP2-2. The first sensing pattern SP2-1 and the second sensing pattern SP2-2 are disposed to be spaced apart from each other in the second direction DR2.

The first sensing electrode SE1 may include a plurality of sensing portions SP1 and intermediate portions BP1 disposed between adjacent sensing portions SP1 and electrically connecting the adjacent sensing portions SP1 to each other. One of two adjacent sensing portions SP1 may be a first sensing portion SP1-1, and the other thereof may be a second sensing portion SP1-2. The intermediate portion BP1 is disposed between the first sensing portion SP1-1 and the second sensing portion SP1-2 in the first direction DR1. In the present embodiment, since the first sensing portion SP1-1, the second sensing portion SP1-2, and the intermediate portion BP1 have an integrated shape, interfaces therebetween are not distinguished. According to the present embodiment, a portion of the first sensing electrode SE1, which is disposed between the first sensing pattern SP2-1 and the second sensing pattern SP2-2 in the second direction DR2, may be the intermediate portion BP1. FIG. 4A illustrates a boundary line of the intermediate portion BP1 with respect to the first sensing portion SP1-1 and the second sensing portion SP1-2 in a dashed line.

FIG. 4A illustrates two bridges BP2 as an example. The number of bridges BP2 in the unit region UA is not particularly limited. The bridge BP2 may include a first bridge pattern B1, a second bridge pattern B2, and a third bridge pattern B3. Each of the first bridge pattern B1, the second bridge pattern B2, and the third bridge pattern B3 may be a conductive pattern. The first bridge pattern B1 is disposed on a different layer from the second bridge pattern B2 and the third bridge pattern B3. The first bridge pattern B1 may be disposed on the same layer as the sensing pattern SP2. In a plan view, the first bridge pattern B1 is disposed in an opening BP1-OP which is provided in the intermediate portion BP1 of the first sensing electrode SE1.

A configuration of the bridge BP2 is not limited thereto. In an embodiment of the present inventive concept, the bridge BP2 may include only one of the second bridge pattern B2 or the third bridge pattern B3. One bridge pattern may be disposed on a different layer from the first sensing pattern SP2-1 and the second sensing pattern SP2-2. The bridge pattern may be directly connected to each of the first sensing pattern SP2-1 and the second sensing pattern SP2-2.

A dummy electrode DE may be disposed between the first sensing pattern SP2-1 and the first sensing portion SP1-1, between the first sensing pattern SP2-1 and the second sensing portion SP1-2, between the second sensing pattern SP2-2 and the first sensing portion SP1-1, and between the second sensing pattern SP2-2 and the second sensing portion SP1-2. The dummy electrode DE may be an electrically isolated floating pattern. In an embodiment of the present inventive concept, the dummy electrode DE may be omitted.

FIG. 4A illustrates boundaries between the first sensing pattern SP2-1, the second sensing pattern SP2-2, the first sensing portion SP1-1, the second sensing portion SP1-2, and the dummy electrode DE in a simplified manner, represented by boundary lines without detailed depiction. In the present embodiment, a boundary line schematically illustrates that interfaces or spacing exist between adjacent components among the first sensing pattern SP2-1, the second sensing pattern SP2-2, the first sensing portion SP1-1, the second sensing potion SP1-2, and the dummy electrode DE.

As illustrated in FIG. 4B, the second bridge pattern B2 and the third bridge pattern B3 are disposed on an encapsulation substrate 210-U. With respect to the sensing region AAO, a conductive layer that is disposed between the encapsulation substrate 210-U and a first insulating layer 221 may be referred to as a first sensing conductive layer SCL1. For example, the second bridge pattern B2 and the third bridge pattern B3 may be the first sensing conductive layer SCL1. For example, the first sensing conductive layer SCL1 may include the second bridge pattern B2 and the third bridge pattern B3.

The second bridge pattern B2 and the third bridge pattern B3 may include metal. The second bridge pattern B2 and the third bridge pattern B3 may include a single-layered metal layer. For example, the first sensing conductive layer SCL1 may be a single-layered structure. Each of the second bridge pattern B2 and the third bridge pattern B3 may include, for example, molybdenum-niobium (MoNb) alloy. Since the second bridge pattern B2 and the third bridge pattern B3 include molybdenum-niobium (MoNb) alloy, they may provide reliable ohmic contact with the first sensing pattern SP2-1, the second sensing pattern SP2-2, and the first bridge pattern B1 that are in contact with the second bridge pattern B2 and the third bridge pattern B3 through contact holes 221-TH. A thickness of each of the second bridge pattern B2 and the third bridge pattern B3 may be about 3500 Å to about 4500 Å.

At least one insulating layer is disposed on an upper surface of the encapsulation substrate 210-U. The first insulating layer 221 may cover the second bridge pattern B2 and the third bridge pattern B3 and may be disposed on the encapsulation substrate 210-U. The first insulating layer 221 may cover the first sensing conductive layer SCL1. The first sensing pattern SP2-1 and the second sensing pattern SP2-2 are disposed on the first insulating layer 221. The intermediate portion BP1 is disposed between the first sensing pattern SP2-1 and the second sensing pattern SP2-2. The first bridge pattern B1 is disposed in the opening BP1-OP of the intermediate portion BP1.

Each of the first sensing pattern SP2-1 and the first bridge pattern B1 is in contact with the second bridge pattern B2 through the contact holes 221-TH penetrating the first insulating layer 221. Each of the first bridge pattern B1 and the second sensing pattern SP2-2 is in contact with the third bridge pattern B3 through the contact holes 221-TH penetrating the first insulating layer 221.

With respect to the sensing region AAO, a conductive layer that is disposed between the first insulating layer 221 and a second insulating layer 222 may be referred to as a second sensing conductive layer SCL2. For example, the first sensing pattern SP2-1, the second sensing pattern SP2-2, the first sensing portion SP1-1, the second sensing portion SP1-2, the intermediate portion BP1, and the first bridge pattern B1 may be the second sensing conductive layer SCL2.

The first sensing pattern SP2-1, the second sensing pattern SP2-2, the first sensing portion SP1-1, the second sensing portion SP1-2, the intermediate portion BP1, and the first bridge pattern B1 may be formed through the same photolithography process and may include the same material as each other. For example, each of the first sensing pattern SP2-1, the second sensing pattern SP2-2, the first sensing portion SP1-1, the second sensing portion SP1-2, the intermediate portion BP1, and the first bridge pattern B1 may include transparent conductive oxide (TCO). For example, each of the first sensing pattern SP2-1, the second sensing pattern SP2-2, the first sensing portion SP1-1, the second sensing portion SP1-2, the intermediate portion BP1, and the first bridge pattern B1 may include indium tin oxide (ITO), indium zinc oxide (IZO), zinc oxide (ZnO), or indium tin zinc oxide (ITZO). For example, a thickness of each of the first sensing pattern SP2-1, the second sensing pattern SP2-2, the first sensing portion SP1-1, the second sensing portion SP1-2, the intermediate portion BP1, and the first bridge pattern B1 may be about 800 Å to about 1300 Å. Since the first sensing pattern SP2-1, the second sensing pattern SP2-2, the first sensing portion SP1-1, the second sensing portion SP1-2, the intermediate portion BP1, and the first bridge pattern B1 include transparent conductive oxide, luminance deterioration may be prevented even if each of the sensing electrodes SE1 and SE2 of FIG. 3 overlaps a corresponding light-emitting element OLED among the light-emitting elements OLED illustrated in FIG. 1D. In an embodiment of the present inventive concept, each of the first sensing pattern SP2-1, the second sensing pattern SP2-2, the first sensing portion SP1-1, the second sensing portion SP1-2, the intermediate portion BP1, and the first bridge pattern B1 may include PEDOT, metal nanowire, or graphene.

As illustrated in FIG. 4B, the second insulating layer 222 is disposed on the first insulating layer 221. The second insulating layer 222 may cover the second sensing conductive layer SCL2. The second insulating layer 222 may cover the first sensing pattern SP2-1, the second sensing pattern SP2-2, the intermediate portion BP1, and the first bridge pattern B1. The second insulating layer 222 may cover the first sensing portion SP1-1 and the second sensing portion SP1-2. Each of the first insulating layer 221 and the second insulating layer 222 may include an inorganic material or an organic material. In the present embodiment, each of the first insulating layer 221 and the second insulating layer 222 may include silicon oxide, silicon nitride, or silicon oxynitride. In the present embodiment, a thickness of the first insulating layer 221 may be, for example, about 4500 Å to about 5500 Å, and a thickness of the second insulating layer 222 may be, for example, about 3500 Å to about 4500 Å. In an embodiment of the present inventive concept, an inorganic layer may be disposed between the encapsulation substrate 210-U and the second bridge pattern B2 and the third bridge pattern B3.

Figure 5A:
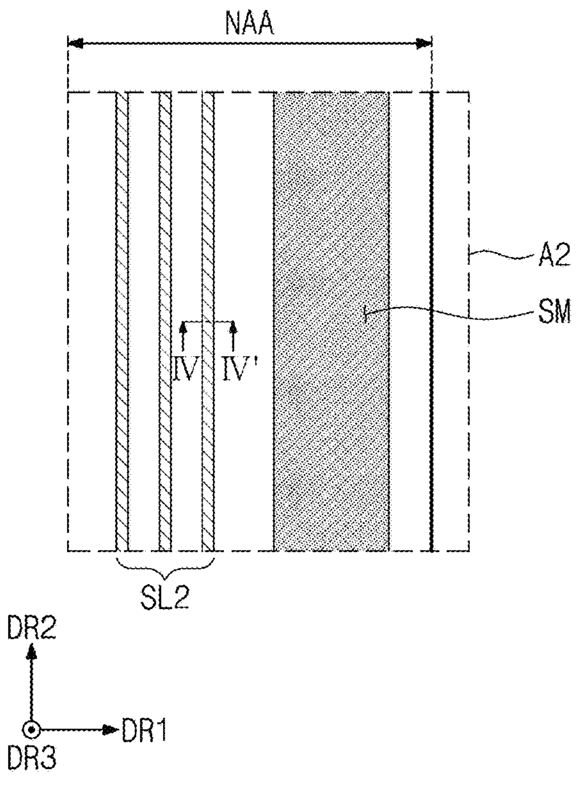
FIG. 5A is a plan view of a second region of FIG. 3.
Figure 5B:
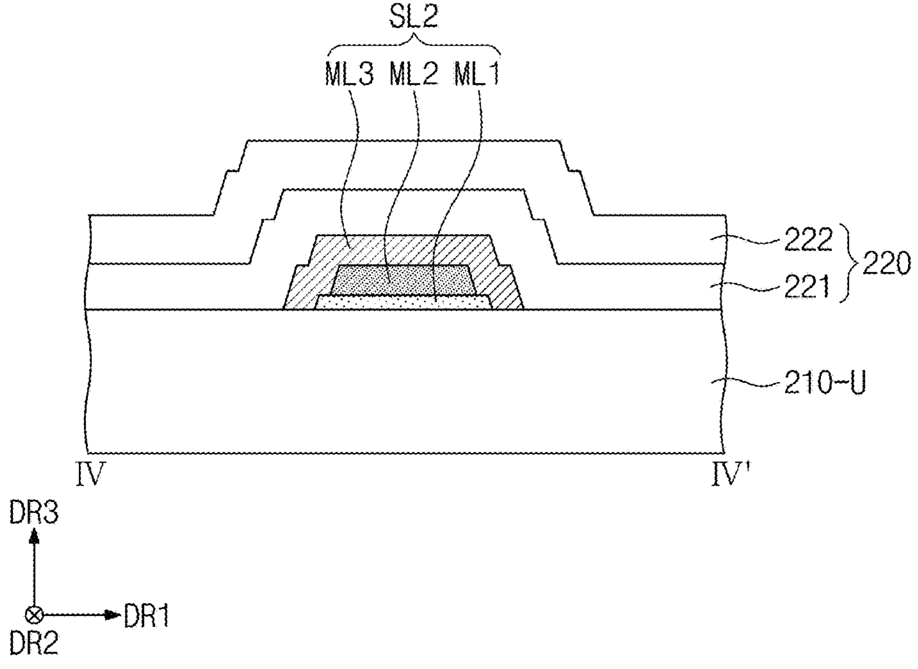
FIGS. 5B and 5C are cross-sectional views taken along line IV-IV' of FIG. 5A.
Figure 5C:
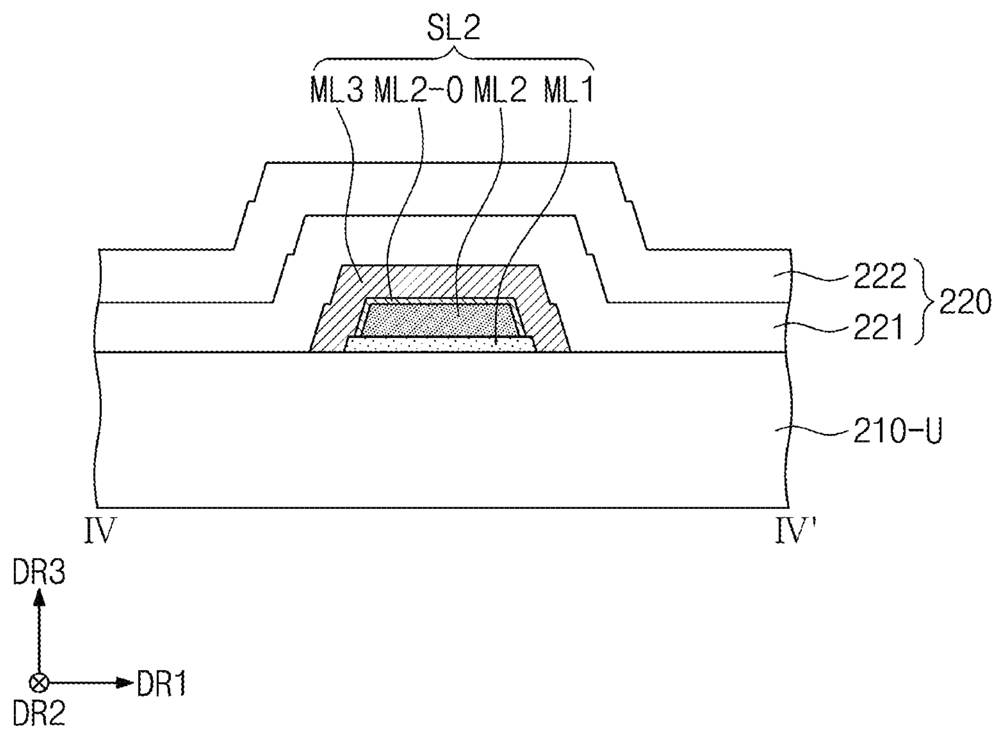

FIG. 5A is a plan view of a second region A2 of FIG. 3. FIGS. 5B and 5C are cross-sectional views taken along line IV-IV' of FIG. 5A.

FIGS. 5A to 5C illustrate second signal lines SL2 as representing the plurality of signal lines SL1, SL2, and SL3 illustrated in FIG. 3. Description of the second signal line SL2 that is to be made later may be equally applied to the first and third signal lines SL1 and SL3.

Referring to FIGS. 5A to 5C, the second signal line SL2 may be disposed between an encapsulation substrate 210-U and a first insulating layer 221. For example, the second signal line SL2 may be disposed on an upper surface of the encapsulation substrate 210-U and may be disposed below the first insulating layer 221. The second signal line SL2 may include a first metal layer ML1, a second metal layer ML2 disposed on the first metal layer ML1, and a third metal layer ML3 disposed on the second metal layer ML2. The second metal layer ML2 has a higher electrical conductivity than the first metal layer ML1 and the third metal layer ML3, and the first metal layer ML1 and the third metal layer ML3 have a higher hardness than the second metal layer ML2.

The first metal layer ML1 is disposed between the encapsulation substrate 210-U and the second metal layer ML2. The second metal layer ML2 is disposed on an upper surface of the first metal layer ML1. For example, at least a portion of the upper surface of the first metal layer ML1 is not covered by the second metal layer ML2. As illustrated in FIGS. 5B and 5C, the second metal layer ML2 is disposed on the first metal layer ML1, and accordingly, an edge portion of the first metal layer ML1 is not in contact with the second metal layer ML2. A portion, of the upper surface of the first metal layer ML1, not being covered by the second metal layer ML2 may be covered with the third metal layer ML3. For example, the portion, of the upper surface of the first metal layer ML1, not being covered by the second metal layer ML2 may be in contact with the third metal layer ML3. Thus, the first metal layer ML1 and the third metal layer ML3 may be electrically connected to each other. Since the first metal layer ML1 and the third metal layer ML3 are in contact with each other and electrically connected to each other, resistance characteristics may be maintained without being changed due to the first metal layer ML1, even if an oxide film is formed on an exposed surface of the second metal layer ML2 during a process. For example, since the first metal layer ML1 is provided, a separate oxide removal process for an upper surface of the second metal layer ML2 is unnecessary. FIG. 5C illustrates, as an example, a case in which an oxide film ML2-O is formed on the second metal layer ML2 during standby in a state in which vacuum is released after the second metal layer ML2 is formed. This may occur because, once the vacuum is released, the exposed surface of the second metal layer ML2 comes into contact with ambient air, allowing oxidation to take place, which may affect its electrical properties. For example, the oxide film ML2-0 may be disposed between the second metal layer ML2 and the third metal layer ML3. A thickness of the first metal layer ML1 may be, for example, about 300 Å to about 700 Å.

The first metal layer ML1 may include molybdenum-niobium (MoNb) alloy.

Since the first metal layer ML1 includes molybdenum-niobium (MoNb) alloy, corrosion resistance under high temperature and high humidity environment may be excellent compared to a case in which the first metal layer ML1 includes only molybdenum (Mo). In addition, since the first metal layer ML1 includes molybdenum-niobium (MoNb) alloy, it exhibits strong adhesion to the encapsulation substrate 210-U on which it is disposed. As a result, the first metal layer ML1 is less likely to detach, even if the second signal line SL2 is scratched from the outside., This may prevent the second signal line SL2 from opening and may ensure that the second signal line SL2 continues to function an electrical path due to the first metal layer ML1. Accordingly, the input sensor 220 (see FIG. 1B) may maintain its reliability even if it is exposed to external scratches, as the first metal layer ML1 helps prevent detachment or electrical disconnection of the second signal line SL2, ensuring stable operation.

The second metal layer ML2 may be disposed on the first metal layer ML1. The second metal layer ML2 may be disposed on the first metal layer ML1. Specifically, when viewed from a cross section perpendicular to an extension direction DR2 of the second signal line SL2, that is, a cross section such as that in FIG. 5B, the second metal layer ML2 may be disposed on the first metal layer ML1. Thus, the first metal layer ML1 may protrude in the first direction DR1 beyond the edges of the second metal layer ML2. For example, a width of the second metal layer ML2 may be smaller than a width of the first metal layer ML1. A thickness of the second metal layer ML2 may be, for example, about 3100 Å to about 4100 Å.

The second metal layer ML2 may include aluminum-neodymium (AlNd) alloy. Aluminum may reduce resistance of the second signal line SL2, and neodymium (Nd) may prevent hillock phenomenon of aluminum.

The third metal layer ML3 may be disposed on the second metal layer ML2. The third metal layer ML3 may cover the first metal layer ML1 and the second metal layer ML2. The third metal layer ML3 may be in contact with an inclined side surface and an upper surface of the second metal layer ML2, and a portion of an upper surface and a side surface of the first metal layer ML1. The third metal layer ML3 may have a clad structure with respect to the second metal layer ML2. A portion, of the first metal layer ML1, not being covered with the second metal layer ML2 may be covered with the third metal layer ML3 and may be in contact with and electrically connected to the third metal layer ML3. A thickness of the third metal layer ML3 may be, for example, about 3500 Å to about 4500 Å.

The third metal layer ML3 may be formed using the same photolithography process as the first sensing conductive layer SCL1 (see FIG. 4B), which is disposed in the sensing region AAO (see FIG. 3). The third metal layer ML3 may be formed through the same photolithography process as the second bridge pattern B2 and the third bridge pattern B3. The third metal layer ML3 may include the same material as the first sensing conductive layer SCL1 (see FIG. 4B), which is disposed in the sensing region AAO (see FIG. 3).

The third metal layer ML3 may include molybdenum-niobium (MoNb) alloy. Molybdenum (Mo) may increase hardness of the second signal line SL2, and niobium (Nb) may increase corrosion resistance of the second metal layer ML2 under high temperature and high humidity environment. The second metal layer ML2 may prevent the second signal line SL2 from being damaged by scratch and being corroded in a subsequent process.

Figure 6:
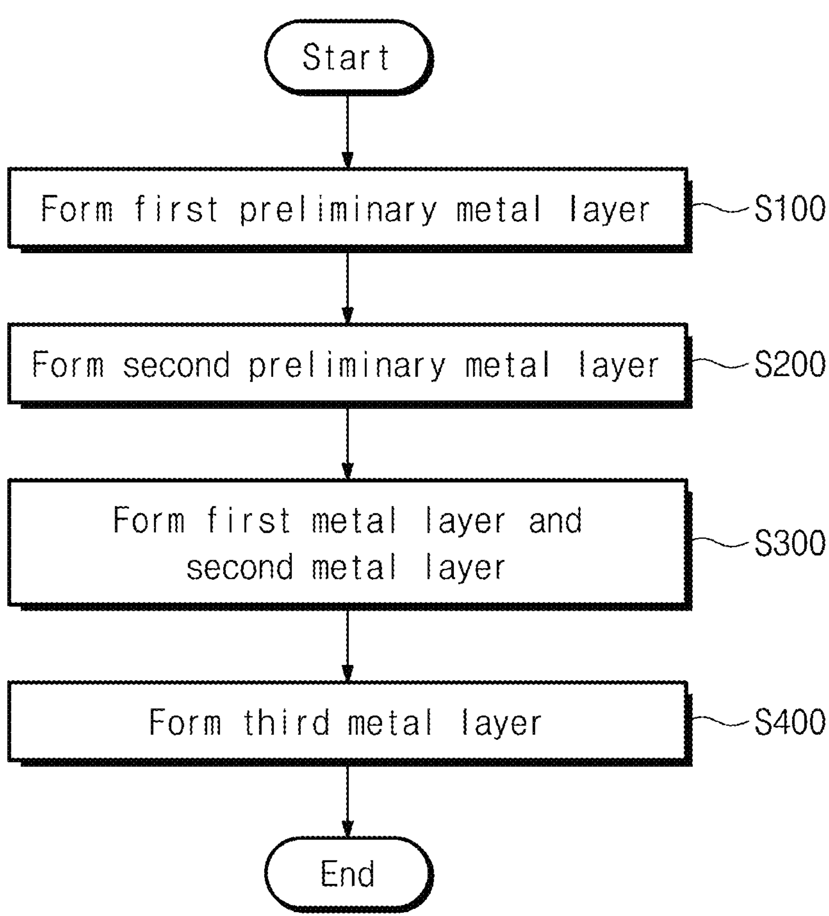
FIG. 6 is a flowchart illustrating a method for manufacturing a signal line according to an embodiment of the present inventive concept.

FIG. 6 is a flowchart illustrating a method for manufacturing the signal line SL2 (see FIG. 5B) according to an embodiment of the present inventive concept. FIGS. 7A to 7D are each a cross-sectional view illustrating a step of a method for manufacturing the signal line SL2 (see FIG. 5B) according to an embodiment of the present inventive concept.

As in FIGS. 5A to 5C, FIGS. 7A to 7D also illustrate a second signal line SL2 as representing the plurality of signal lines SL1, SL2, and SL3 illustrated in FIG. 3. Description of the second signal line SL2 that is to be made later may be equally applied to the first and third signal lines SL1 and SL3.

Referring to FIG. 6, the method for manufacturing the signal line SL2 (see FIG. 5B) according to an embodiment of the present inventive concept includes forming a first preliminary metal layer P-ML1 (S100), forming a second preliminary metal layer P-ML2 (S200), forming a first metal layer ML1 and a second metal layer ML2 (S300), and forming a third metal layer ML3 (S400).

Figure 7A:
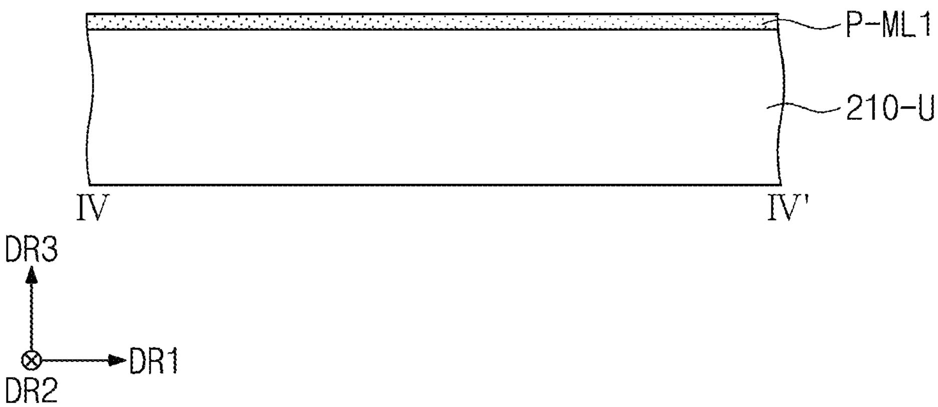
FIGS. 7A, 7B, 7C and 7D are each a cross-sectional view illustrating a step of a method for manufacturing a signal line according to an embodiment of the present inventive concept.

FIG. 7A is a cross-sectional view schematically illustrating the forming of the first preliminary metal layer P-ML1 (S100). The first preliminary metal layer P-ML1 may be formed on an encapsulation substrate 210-U. The first preliminary metal layer P-ML1 may be formed as a molybdenum-niobium (MoNb) alloy layer through, for example, a sputtering process.

Figure 7B:
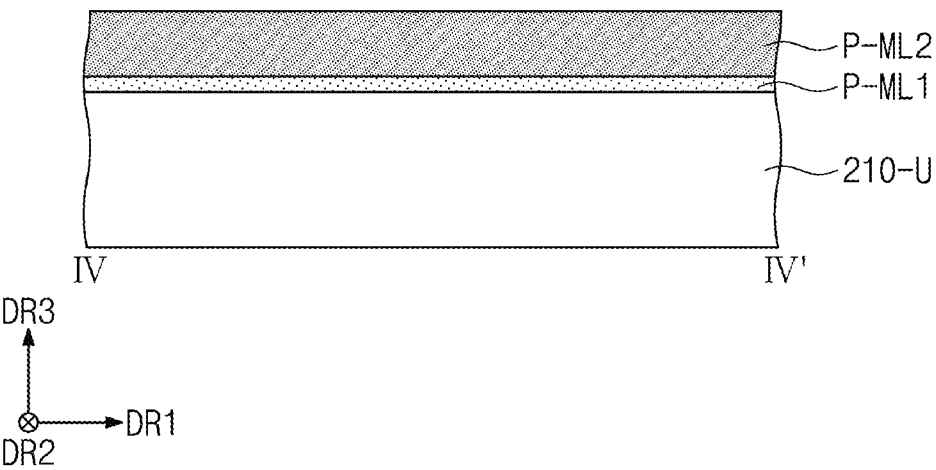

FIG. 7B is a cross-sectional view schematically illustrating the forming of the second preliminary metal layer P-ML2 (S200). The second preliminary metal layer P-ML2 may be formed on the first preliminary metal layer P-ML1. The second preliminary metal layer P-ML2 may be formed as an aluminum-neodymium (AlNd) alloy layer through, for example, a sputtering process.

Figure 7C:
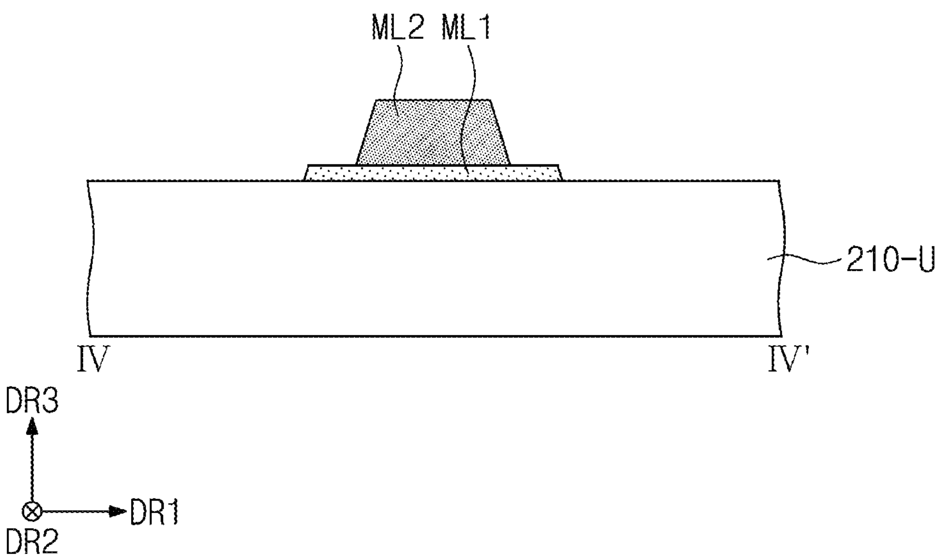

FIG. 7C is a cross-sectional view schematically illustrating the forming of the first metal layer ML1 and the second metal layer ML2 (S300). The first metal layer ML1 and the second metal layer ML2 may be patterned into a line shape through a photolithography process. The first preliminary metal layer P-ML1 and the second preliminary metal layer P-ML2 may be patterned by an etching process through one mask. In addition, the second preliminary metal layer P-ML2 may have higher etch rate for an etchant than the first preliminary metal layer P-ML1. Thus, after the etching process, the first metal layer ML1 may extend beyond the second metal layer ML2 due to the higher etch rate of the second preliminary metal layer P-ML2 compared to the first preliminary metal layer P-ML1. That is, the second metal layer ML2 may be formed on the first metal layer ML1. In addition, the first preliminary metal layer P-ML1 and the second preliminary metal layer P-ML2 might not be patterned by an etching process through one mask but may be each patterned by an etching process through a separate mask.

After the first metal layer ML1 and the second metal layer ML2 are formed, the oxide film ML2-O (see FIG. 5C) may be formed on the second metal layer ML2 during standby time before forming the third metal layer ML3 to be described later. However, since the second signal line SL2, according to an embodiment of the present inventive concept, includes the first metal layer ML1, an electrical connection path may be maintained, and thus a process of removing the oxide film ML2-O (see FIG. 5C) may be unnecessary. Accordingly, since an additional process is unnecessary, process cost may be reduced, and reliability may be increased.

Figure 7D:
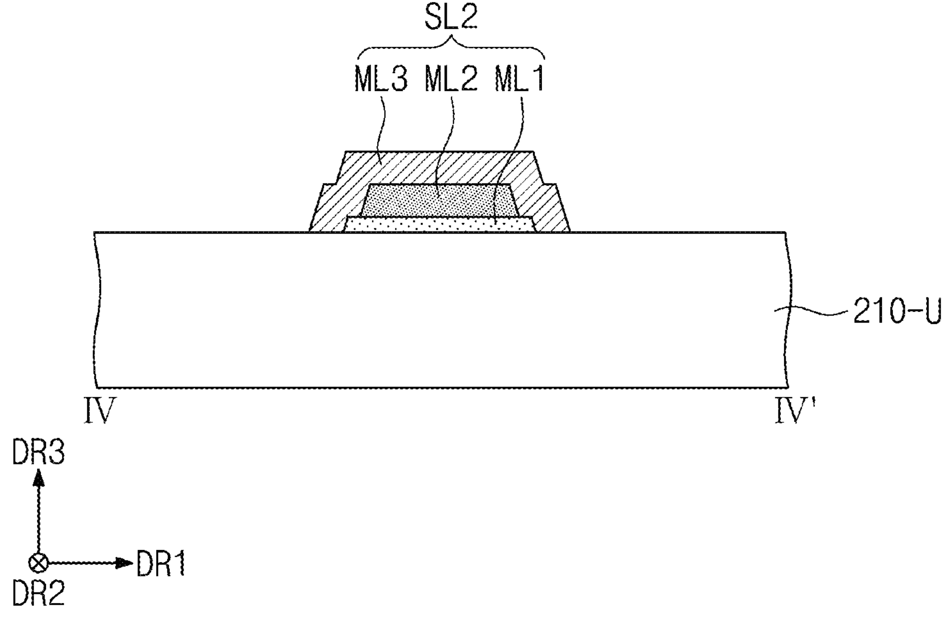

FIG. 7D is a cross-sectional view schematically illustrating the forming of the third metal layer ML3 (S400). The third metal layer ML3 may be patterned into a line shape through a photolithography process. The third metal layer ML3 may be formed having a clad structure covering the second metal layer ML2.

Figure 8:
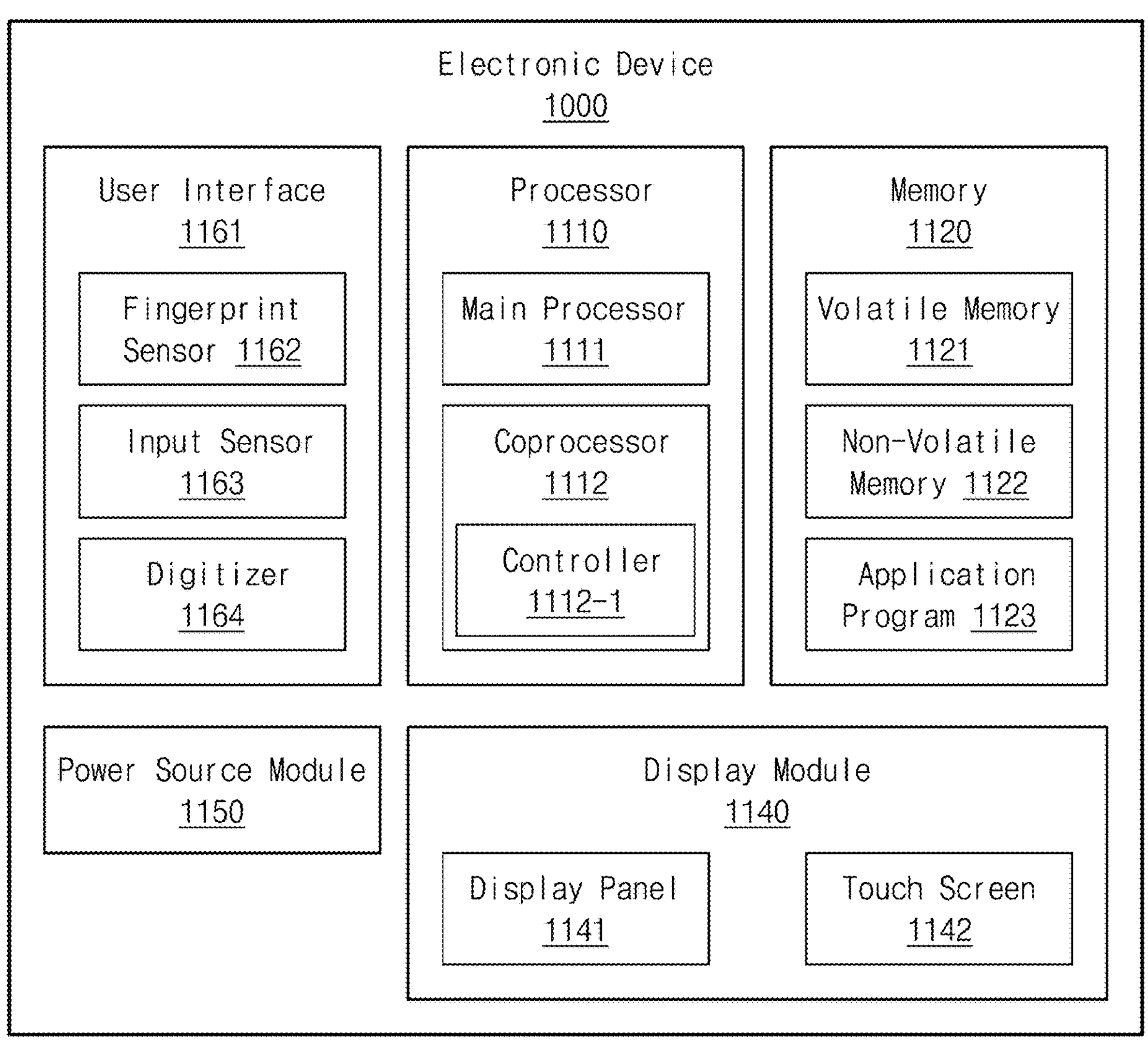
FIG. 8 is a block diagram illustrating an electronic device according to an embodiment of the present inventive concept.

FIG. 8 is a diagram illustrating an electronic device (e.g., an electronic apparatus) according to an embodiment of the present inventive concept. Referring to FIG. 8, the electronic device 1000 according to one embodiment of the present inventive concept may output various information (e.g., images, text, music, etc.) through a display module 1140, which, for example, may correspond to the display device shown in FIGS. 1A and 1C. When a processor 1110 executes an application stored in a memory 1120, the display module 1140 may provide application information to a user through a display panel 1141.

In some embodiments, the electronic device 1000 may be configured as a smartphone, camera, smart TV, monitor, smartwatch, tablet, automotive display, or AR/VR headset. For example, the electronic device 1000 may be a smartphone including a touch-sensitive display area DA for interaction and a non-display area NDA including sensors and circuits for enhanced functionality. For example, the electronic device 1000 may be a television or monitor including a large display area DA for high-resolution video playback and a non-display area NDA incorporating driving circuits or connectivity modules for external inputs. For example, the electronic device 1000 may be a smartwatch including a display area DA optimized for compact and high-clarity visuals and a non-display area NDA integrating biometric sensors for health monitoring. In some cases, the electronic device 1000 be an AR/VR headset.

In some embodiments, memory 1120 may store information such as software codes for operating an application program 1123. The application program 1123 may include a software designed to execute specific tasks or provide functionality to a user. The application program 1123 may operate under the control of the processor 1110 and utilizes data stored in the memory 1120 to deliver a wide range of features, such as productivity tools, multimedia streaming and playback, file or mail deliveries or communication services. The application program 1123 interacts seamlessly with the user interface 1161 or touch screen 1142, allowing a user to launch, navigate, and utilize the program through user inputs such as touch, tap, gesture, or voice interaction.

Upon user selection of an application via touch screen 1142 or user interface 1161, the processor 1110 may execute the application program 1123 corresponding to the selected application retrieved from the memory 1120 to perform functionalities of the application. For example, when a user selects a camera application by tapping the icon (or a camera application icon) presented on the display panel 1141, the processor 1110 activates a camera module. The processor 1110 may transmit image data corresponding to a captured image acquired through the camera module to the display module 1140. The display module 1140 may display an image corresponding to the captured image through the display panel 1141.

As another example, when a user wishes to make a phone call, the user taps the telephone icon displayed on the display module 1140, the processor 1110 may execute a phone application program stored in the memory 1120. A telephone keypad may be presented on the display panel 1141 for the user to enter a phone number to call.

As another example, the display module 1140 may be integrated into an electronic device 1000, such as a laptop computer, smart TV, or tablet. A user wishing to access a multimedia streaming application (e.g., to watch a music video or movie) can do so by tapping the corresponding icon. This action activates the application, allowing the user to view the streamed content.

The processor 1110 may include a main processor 1111 and an auxiliary or coprocessor 1112. The main processor 1111 may include a central processing unit (CPU). The main processor 1111 may further include one or more of a graphics processing unit (GPU), a communication processor (CP), and an image signal processor (ISP).

The coprocessor 1112 may include a controller 1112-1. The controller 1112-1 may include an interface conversion circuit and a timing control circuit. The controller 1112-1 may receive an image signal from the main processor 1111, convert the data format of the image signal to match the interface specifications with the display module 1140, and output image data. The controller 1112-1 may output various control signals to drive the display module 1140. For example, the controller 1112-1 may drive the display module 1140 to display the icon on the display screen suitable for selection by a user to cause execution of an application program 1123.

The memory 1120 may store one or more application programs 1123 and various data used by at least one component (for example, the processor 1110 or the user interface 1161) of the electronic device 1000 and input data or output data for commands related thereto. For example, a camera application program, a GPS application program, an augmented reality and virtual reality application program, and other application programs that can be executed by the processor 1110 upon selection of corresponding icons presented on the display screen (or display panel 1141) via the touch screen 1142 or user interface 1161 by the user. In addition, various setting data corresponding to user settings may be stored in the memory 1120. The memory 1120 may include volatile memory 1121 and non-volatile memory 1122.

The display module 1140 may output visual information (images) to the user. The display module 1140 may include the display panel 1141, a gate driver, the source driver, a voltage generation circuit, and a touch screen 1142. The display module 1140 may further include a window, a chassis, and a bracket to protect the display panel 1141. The display module 1140 may include at least a part of the configuration of the display device shown in FIGS. 1A and 1C.

The user interface 1161 serves as the interaction medium between a user and the electronic device 1000. The user interface 1161 may detect an input by a part (e.g., finger) of a user's body or an input by a pen or a mouse, and generate an electric signal or data value corresponding to the input. The user interface 1161 includes the fingerprint sensor 1162, the input sensor 1163, and a digitizer 1164.

The fingerprint sensor 1162 may sense a fingerprint for biometric recognition of the user and may also measure one or more biological signals such as blood pressure, moisture, or body mass.

The input sensor 1163 may sense user interactions including touch, tap, gesture, motion, spoken command, and eye movement. The input sensor 1163 includes optical sensors for image capture, eye tracking, or motion and gesture detection. Optical sensors may be infrared or semiconductor photodetectors. The input sensor 1163 includes audio and acoustic sensors, which may be MEMS microphones for voice recognition or sound-based interaction. The audio and acoustic sensors can be installed as part of the user interface 1161 or embedded in the display panel 1141.

The digitizer 1164 may generate a data value corresponding to coordinate information of input by a pen or a mouse to control movement of an onscreen cursor. The digitizer 1164 may generate the amount of change in electromagnetic due to the input as the data value. The digitizer may detect an input by a passive pen or transmit and receive data with an active pen or a remote.

At least one of the fingerprint sensor 1162, the input sensor 1163, or the digitizer 1164 may be implemented as a sensor layer formed on the top layer of the display panel 1141 through a continuous process with a process of forming elements (for example, the light emitting element, the transistor, and the like) included in the display panel 1141.

In addition, the user interface 1161 may further include, for example, a gesture sensor, a gyro sensor that senses rotational movements, an acceleration sensor to track translational movement, a grip sensor, a pressure sensor, a proximity sensor, a color sensor, an infrared (IR) emitter and camera sensor for tracking gaze direction and eye movements, a temperature sensor, or a light sensor. For example, the gyro sensor, acceleration sensor, and infrared emitter and camera may be particularly suitable for AR/VR headset functions.

The touch screen 1142 includes touch sensors embedded in semiconductor layers of the display panel 1141 to sense pressure applied to the top layer (screen) of the display panel 1141. The touch sensors can be a capacitive or a resistive type. The touch screen 1142 may serve as the primary interface for the user to select and navigate applications, control, and interact with the electronic device 1000.

The display panel 1141 (or display) may include a liquid crystal display panel, an organic light emitting display panel, or an inorganic light emitting display panel, and the type of the display panel 1141 is not particularly limited. The display panel 1141 may be of a rigid type or a flexible type that can be rolled or folded. The display module 1140 may further include a supporter, bracket, heat dissipation member, and the like that support the display panel 1141. The display panel 1141 may include the display panel shown in FIG. 1C.

The power source module 1150 may supply power to the components of the electronic device 1000. The power source module 1150 may include a battery that charges the power source voltage. The battery may include a non-rechargeable primary battery or a rechargeable secondary battery or fuel cell. The power source module 1150 may include a power management integrated circuit (PMIC). The PMIC may supply optimized power source to each of the components described above including the display module 1140.

For example, the disclosure about the electronic device 1000 of FIG. 8 may be combinable with the disclosure about the electronic apparatus previously discussed.

According to the above descriptions, a signal line of an input sensor according to an embodiment of the present inventive concept may include a second metal layer having low resistance, and thus signal delay may be reduced. The signal line of the input sensor may include a third metal layer having relatively high hardness, and thus, the second metal layer may be protected.

In addition, the signal line may include a first metal layer disposed under the second metal layer and in contact with the third metal layer. As a result, electrical characteristics of the signal line may be maintained even if the second metal layer is oxidized or sustains damage due to external scratches or hillock formation.

Thus, reliability of a display device including the input sensor according to an embodiment of the present inventive concept and an electronic apparatus including the same may be improved.

While the present inventive concept has been particularly shown and described with reference to embodiments thereof, it will be apparent to those of ordinary skill in the art that various changes in form and detail may be made thereto without departing from spirit and scope of the present inventive concept.

What is claimed is:

1. A display device comprising:

a display panel including a light-emitting element; and an input sensor disposed on the display panel and including a first insulating layer, a sensing electrode, and a signal line electrically connected to the sensing electrode, wherein the sensing electrode includes:

a first sensing conductive layer disposed under the first insulating layer; and a second sensing conductive layer electrically connected to the first sensing conductive layer and disposed on the first insulating layer, and the signal line includes:

a first metal layer including molybdenum-niobium (MoNb) alloy;

a second metal layer including aluminum-neodymium (AlNd) alloy and disposed on the first metal layer; and a third metal layer including molybdenum-niobium (MoNb) alloy and disposed on the second metal layer, wherein the signal line extends in at least a first direction, the first metal layer comprises an upper surface, a lower surface, and a side surface, wherein the upper surface faces the second metal layer, wherein the lower surface is opposed to the upper surface, and the side surface connects the upper surface and the lower surface to each other, the second metal layer is directly disposed on a portion of the upper surface of the first metal layer, and the third metal layer is directly disposed on the side surface and a remaining portion, on which the second metal layer is not disposed, of the upper surface of the first metal layer, and the first metal layer and the third metal layer are electrically connected to each other.

2. The display device of claim 1, wherein the first metal layer is disposed in the third metal layer, and the second metal layer is disposed in the first metal layer.

3. The display device of claim 1, wherein the signal line further comprises an oxide film disposed between the second metal layer and the third metal layer.

4. The display device of claim 1, wherein the input sensor comprises a sensing region, in which an external input is sensed, and a non-sensing region adjacent to the sensing region, wherein the sensing electrode is disposed in the sensing region, and the signal line is disposed in the non-sensing region.

5. The display device of claim 1, wherein the sensing electrode comprises:

a first sensing electrode extending along the first direction and arranged along a second direction perpendicular to the first direction; and a second sensing electrode extending along the second direction and arranged along the first direction.

6. The display device of claim 5, wherein the first sensing electrode comprises a first sensing portion, a second sensing portion spaced apart from the first sensing portion, and an intermediate portion disposed between the first sensing portion and the second sensing portion, wherein the second sensing electrode comprises a first sensing pattern, a second sensing pattern spaced apart from the first sensing pattern, and a bridge electrically connecting the first sensing pattern and the second sensing pattern to each other, wherein the bridge includes a first bridge pattern, a second bridge pattern connected to the first sensing pattern, and a third bridge pattern connected to the second sensing pattern, and the first bridge pattern is connected to each of the second bridge pattern and the third bridge pattern, wherein the second bridge pattern and the third bridge pattern are at least portions of the first sensing conductive layer, and the first sensing portion, the second sensing portion, the intermediate portion, and the first bridge pattern are at least portions of the second sensing conductive layer.

7. The display device of claim 6, wherein an opening is defined in the intermediate portion, and the first bridge pattern is disposed in the opening.

8. The display device of claim 1, wherein the first sensing conductive layer comprises molybdenum-niobium (MoNb) alloy, and the second sensing conductive layer comprises indium tin oxide (ITO).

9. The display device of claim 1, wherein the signal line is disposed under the first insulating layer.

10. The display device of claim 1, wherein the input sensor further comprises a second insulating layer disposed on the first insulating layer, and the second sensing conductive layer is disposed between the first insulating layer and the second insulating layer.

11. The display device of claim 1, wherein the second sensing conductive layer is in contact with the first sensing conductive layer through a contact hole penetrating the first insulating layer.

12. The display device of claim 1, wherein the first sensing conductive layer and the third metal layer are formed through a same photolithography process.

13. The display device of claim 10, wherein each of the first insulating layer and the second insulating layer comprises silicon oxide, silicon nitride, or silicon oxynitride.

14. The display device of claim 1, wherein the first sensing conductive layer has a single-layered structure.

15. An electronic apparatus comprising:

a processor;

a memory having stored application programs for execution by the processor;

a display device including an active region and a peripheral region adjacent to the active region, wherein in the active region, an image is displayed and an external input is sensed, wherein the processor is caused to execute one or more of the stored application programs upon receipt of the external input; and a window member disposed on the display device and including a transmission region corresponding to the active region and a bezel region corresponding to the peripheral region, wherein the display device includes:

a display panel including a light-emitting element; and an input sensor disposed on the display panel and including a first insulating layer, a sensing electrode, and a signal line electrically connected to the sensing electrode, wherein the sensing electrode includes:

a first sensing conductive layer disposed under the first insulating layer; and a second sensing conductive layer electrically connected to the first sensing conductive layer and disposed on the first insulating layer, and the signal line includes:

a first metal layer including molybdenum-niobium (MoNb) alloy;

a second metal layer including aluminum-neodymium (AlNd) alloy and disposed on the first metal layer; and a third metal layer including molybdenum-niobium (MoNb) alloy and disposed on the second metal layer, wherein the signal line extends in at least a first direction, the first metal layer comprises an upper surface, a lower surface, and a side surface, wherein the upper surface faces the second metal layer, wherein the lower surface is opposed to the upper surface, and the side surface connects the upper surface and the lower surface to each other, the second metal layer is directly disposed on a portion of the upper surface of the first metal layer, and the third metal layer is directly disposed on the side surface and a remaining portion, on which the second metal layer is not disposed, of the upper surface of the first metal layer, and the first metal layer and the third metal layer are electrically connected to each other.

16. The electronic apparatus of claim 15, wherein the first metal layer is disposed in the third metal layer, and the second metal layer is disposed in the first metal layer.

17. The electronic apparatus of claim 15, wherein the signal line further comprises an oxide film disposed between the second metal layer and the third metal layer, and wherein the first sensing conductive layer comprises molybdenum-niobium (MoNb) alloy, and the second sensing conductive layer comprises indium tin oxide (ITO).

18. An electronic device comprising:

a display panel including a light-emitting element; and an input sensor disposed on the display panel and including a first insulating layer, a sensing electrode, and a signal line electrically connected to the sensing electrode, wherein the sensing electrode includes:

a first sensing conductive layer disposed under the first insulating layer; and a second sensing conductive layer electrically connected to the first sensing conductive layer and disposed on the first insulating layer, and the signal line includes:

a first metal layer including molybdenum-niobium (MoNb) alloy;

a second metal layer including aluminum-neodymium (AlNd) alloy and disposed on the first metal layer; and a third metal layer including molybdenum-niobium (MoNb) alloy and disposed on the second metal layer, wherein the sensing electrode comprises:

a first sensing electrode extending along a first direction and arranged along a second direction perpendicular to the first direction; and a second sensing electrode extending along the second direction and arranged along the first direction.

* * * * *